(12) United States Patent
Shang et al.

(10) Patent No.: US 12,745,512 B2
(45) Date of Patent: Sep. 22, 2026

(54) ARRAY SUBSTRATE, DISPLAY PANEL AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tinghua Shang, Beijing (CN); Yi Zhang, Beijing (CN); Haigang Qing, Beijing (CN); Biao Liu, Beijing (CN); Bangqing Xiao, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 435 days.

(21) Appl. No.: 18/576,369

(22) PCT Filed: Apr. 12, 2023

(86) PCT No.: PCT/CN2023/087854

§ 371 (c)(1),
(2) Date: Jan. 4, 2024

(87) PCT Pub. No.: WO2023/198113

PCT Pub. Date: Oct. 19, 2023

(65) Prior Publication Data

US 2024/0292659 A1 Aug. 29, 2024

(30) Foreign Application Priority Data

Apr. 15, 2022 (CN) ........................ 202210396037.5

(51) Int. Cl.
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
CPC ........... H10K 59/1213; H10K 59/1216; H10K 59/131; H10K 59/126; H10D 86/481; H10D 86/60; H10D 86/441; H10W 42/20
See application file for complete search history.

(56) References Cited

U.S. PATENT DOCUMENTS 10,417,960 B2 * 9/2019 Xiang .................. G09G 3/3225
11,373,599 B1 * 6/2022 Chen .................... H10K 59/131
(Continued)

FOREIGN PATENT DOCUMENTS

CN 105869573 A 8/2016
CN 109742092 A 5/2019
(Continued)

*Primary Examiner* — Dao H Nguyen
(74) *Attorney, Agent, or Firm* — XSENSUS LLP

(57) ABSTRACT

An array substrate includes a plurality of pixel driving circuits, and each pixel driving circuit at least includes a compensation transistor. The array substrate includes a substrate, an active layer, a first gate layer and a second gate layer. The active layer includes an active layer pattern of the compensation transistor, which includes two channel areas and a conductive area therebetween. The first gate layer includes a first gate signal line, and an orthographic projection of the first gate signal line on the substrate is overlapped with orthographic projections of the two channel areas on the substrate. The second gate layer includes a voltage stabilization pattern, which is configured to receive a power supply voltage signal, and an orthographic projection of the voltage stabilization pattern on the substrate is overlapped (Continued)

with an orthographic projection of the conductive area on the substrate.

18 Claims, 23 Drawing Sheets

(56) References Cited

U.S. PATENT DOCUMENTS

| | | | | |
|---|---|---|---|---|
| 12,262,610 | B2 * | 3/2025 | Kim | G09G 3/3225 |
| 2016/0232849 | A1 * | 8/2016 | Jeon | G09G 3/3233 |
| 2019/0267440 | A1 * | 8/2019 | Park | H10K 59/124 |
| 2020/0227500 | A1 | 7/2020 | Chen et al. | |
| 2020/0312926 | A1 * | 10/2020 | Bae | H10K 59/121 |
| 2021/0057498 | A1 * | 2/2021 | Pahk | H10K 59/122 |
| 2021/0202759 | A1 * | 7/2021 | Lee | H10D 30/6734 |
| 2022/0045159 | A1 * | 2/2022 | Lee | H10K 59/131 |

FOREIGN PATENT DOCUMENTS

| | | | |
|---|---|---|---|
| CN | 114093918 | A | 2/2022 |
| CN | 114122101 | A | 3/2022 |
| CN | 114823727 | A | 7/2022 |
| KR | 10-2019-0080207 | A | 7/2019 |

* cited by examiner

ARRAY SUBSTRATE, DISPLAY PANEL AND DISPLAY APPARATUS

CROSS-REFERENCE TO RELATED APPLICATIONS

This application is a national phase entry under 35 USC 371 of International Patent Application No. PCT/CN2023/087854, filed on Apr. 12, 2023, which claims priority to Chinese Patent Application No. 202210396037.5, filed on Apr. 15, 2022, which are incorporated herein by reference in their entirety.

TECHNICAL FIELD

The present disclosure relates to the field of display technologies, and in particular, to an array substrate, a display panel and a display apparatus.

BACKGROUND

The display panel includes a plurality of pixels arranged in an array, and each pixel includes a pixel driving circuit and a light-emitting device that are electrically connected. The pixel driving circuit controls light-emitting brightness and light-emitting time of the light-emitting device by controlling on and off of its internal transistor(s). The light-emitting devices of the plurality of pixels work together to enable the display panel to display an image.

SUMMARY

In an aspect, an array substrate is provided. The array substrate includes a plurality of pixel driving circuits arranged in an array, and each pixel driving circuit at least includes a compensation transistor. The array substrate includes: a substrate, an active layer, a first gate layer and a second gate layer. The active layer provided on the substrate includes an active layer pattern of the compensation transistor, and the active layer pattern of the compensation transistor includes two channel areas and a conductive area located between the two channel areas. The first gate layer disposed on a side of the active layer away from the substrate includes a first gate signal line, and an orthographic projection of the first gate signal line on the substrate is overlapped with orthographic projections of the two channel areas on the substrate. The second gate layer disposed on a side of the first gate layer away from the substrate includes a voltage stabilizing pattern. The voltage stabilizing pattern is configured to receive a power supply voltage signal. An orthographic projection of the voltage stabilizing pattern on the substrate is overlapped with an orthographic projection of the conductive area on the substrate.

In some embodiments, the two channel areas include a first channel area and a second channel area. The active layer pattern of the compensation transistor includes a first pattern and a second pattern that are connected, the first pattern extends in a first direction, the second pattern extends in a second direction, and the first direction intersects the second direction. The first channel area is located in the first pattern, the second channel area is located in the second pattern, and the conductive area is located at a connection position between the first pattern and the second patter.

The first gate signal line includes a first gate signal main line and at least one first extension portion connected to the first gate signal main line, the first gate signal main line extends in the first direction, and the first extension portion extends in the second direction; an orthographic projection of the first gate signal main line on the substrate is overlapped with an orthographic projection of the second pattern on the substrate, and an orthographic projection of a first extension portion in the at least one first extension portion on the substrate is overlapped with an orthographic projection of the first pattern on the substrate.

In some embodiments, the pixel driving circuit further includes a capacitor. The first gate layer further includes a first electrode plate of the capacitor, the second gate layer further includes a second electrode plate of the capacitor, and an orthographic projection of the second electrode plate on the substrate is overlapped with an orthographic projection of the first electrode plate on the substrate. The voltage stabilizing pattern is connected to the second electrode plate, and the voltage stabilizing pattern is located on a side of the second electrode plate proximate to the first gate signal line.

In some embodiments, the orthographic projection of the first gate signal main line on the substrate and the orthographic projection of the first extension portion in the at least one first extension portion have at least one corner, and the orthographic projection of the voltage stabilizing pattern on the substrate is located on an inner side of a corner.

In some embodiments, the array substrate further includes: a first insulating layer disposed between the active layer and the first gate layer, a second insulating layer disposed between the first gate layer and the second gate layer, a third insulating layer disposed on a side of the second gate layer away from the substrate, and a first source-drain metal layer disposed on a side of the third insulating layer away from the substrate. The first source-drain metal layer includes a first connection end and a first connection pattern. The first connection end is connected to the active layer through a via hole extending through the first insulating layer, the second insulating layer and the third insulating layer. The first connection pattern includes a first end, a first connection line and a second end that are connected in sequence, and the first end is connected to the active layer through a via hole extending through the first insulating layer, the second insulating layer and the third insulating layer. The second gate layer further includes at least one shielding pattern, an orthographic projection of a shielding pattern in the at least one shielding pattern on the substrate is located between the first connection end and the first end of the first connection pattern that are adjacent. The at least one shielding pattern is configured to receive a constant voltage signal.

In some embodiments, the pixel driving circuit further includes a writing transistor, the active layer further includes an active layer pattern of the writing transistor, and the first connection end is connected to the active layer pattern of the writing transistor. The pixel driving circuit further includes a capacitor, the first gate layer further includes a first electrode plate of the capacitor, and the second gate layer further includes a second electrode plate of the capacitor. The first end of the first connection pattern is connected to the active layer pattern of the compensation transistor, and the second end of the first connection pattern is connected to the first electrode plate of the capacitor.

In some embodiments, the second gate layer further includes initialization signal lines, and the at least one shielding pattern is connected to an initialization signal line.

In some embodiments, the initialization signal lines include a first initialization signal line, and the first initialization signal line is connected to the at least one shielding pattern. The pixel driving circuit further includes a first reset transistor, the active layer further includes an active layer pattern of the first reset transistor, and the first initialization signal line is electrically connected to the active layer pattern of the first reset transistor.

In some embodiments, the first source-drain metal layer further includes a second connection pattern; the second connection pattern includes a third end, a second connection line and a fourth end that are connected in sequence; the third end is connected to the first initialization signal line through a via hole extending through the third insulating layer, and the fourth end is connected to the active layer pattern of the first reset transistor through a via hole extending through the first insulating layer, the second insulating layer and the third insulating layer.

In some embodiments, the display substrate further includes a fourth insulating layer disposed on a side of the first source-drain metal layer away from the substrate, and a second source-drain metal layer disposed on a side of the fourth insulating layer away from the substrate. The second source-drain metal layer includes a data line and a power supply voltage signal line, and the data line is connected to the first connection end through a via hole extending through the fourth insulating layer.

In some embodiments, the pixel driving circuit further includes a capacitor, the first gate layer further includes a first electrode plate of the capacitor, and the second gate layer further includes a second electrode plate of the capacitor. The first source-drain metal layer further includes at least one third connection pattern. A third connection pattern includes a fifth end, a third connection line and a sixth end that are connected in sequence. The fifth end is connected to the second electrode plate of the capacitor through a via hole extending through the third insulating layer, and the power supply voltage signal line is connected to the sixth end through a via hole extending through the fourth insulating layer. The pixel driving circuit further includes a first enable transistor, and the active layer further includes an active layer pattern of the first enable transistor. The sixth end of the third connection pattern is connected to the active layer pattern of the first enable transistor through a via hole extending through the first insulating layer, the second insulating layer and the third insulating layer.

In some embodiments, the pixel driving circuit further includes a second enable transistor, and the active layer further includes an active layer pattern of the second enable transistor. The first gate layer further includes an enable signal line, and an orthographic projection of the enable signal line on the substrate is overlapped with an orthographic projection of the active layer pattern of the first enable transistor on the substrate and an orthographic projection of the active layer pattern of the second enable transistor on the substrate.

In some embodiments, the pixel driving circuit further includes a second reset transistor, and the active layer further includes an active layer pattern of the second reset transistor. The second gate layer further includes initialization signal lines, and the initialization signal lines include a second initialization signal line, and the second initialization signal line is connected to the active layer pattern of the second reset transistor.

In some embodiments, the first gate layer further includes a first reset signal line and a second reset signal line. The pixel driving circuit further includes a first reset transistor, the active layer further includes an active layer pattern of the first reset transistor. An orthographic projection of the first reset signal line on the substrate is overlapped with an orthographic projection of the active layer pattern of the first reset transistor on the substrate. An orthographic projection of the second reset signal line on the substrate is overlapped with an orthographic projection of the active layer pattern of the second reset transistor on the substrate.

In some embodiments, the pixel driving circuit further includes a driving transistor, the active layer further includes an active layer pattern of the driving transistor; and an orthographic projection of the active layer pattern of the driving transistor on the substrate is overlapped with an orthographic projection of the first electrode plate on the substrate.

In another aspect, a display panel is provided. The display panel includes the array substrate in any of the embodiments in the above aspect.

In some embodiments, the display panel further includes: an anode layer disposed on the array substrate, the anode layer including a plurality of anodes; a light-emitting layer disposed on a side of the anode layer away from the substrate; a cathode layer disposed on a side of the light-emitting layer away from the substrate; and an encapsulation layer disposed on a side of the cathode layer away from the substrate.

In yet another aspect, a display apparatus is provided. The display apparatus includes the display panel in any of the embodiments in the above aspect.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

DETAILED DESCRIPTION

Figure 1:
FIG. 1 is a structural diagram of a display apparatus, in accordance with some embodiments.
Figure 1:
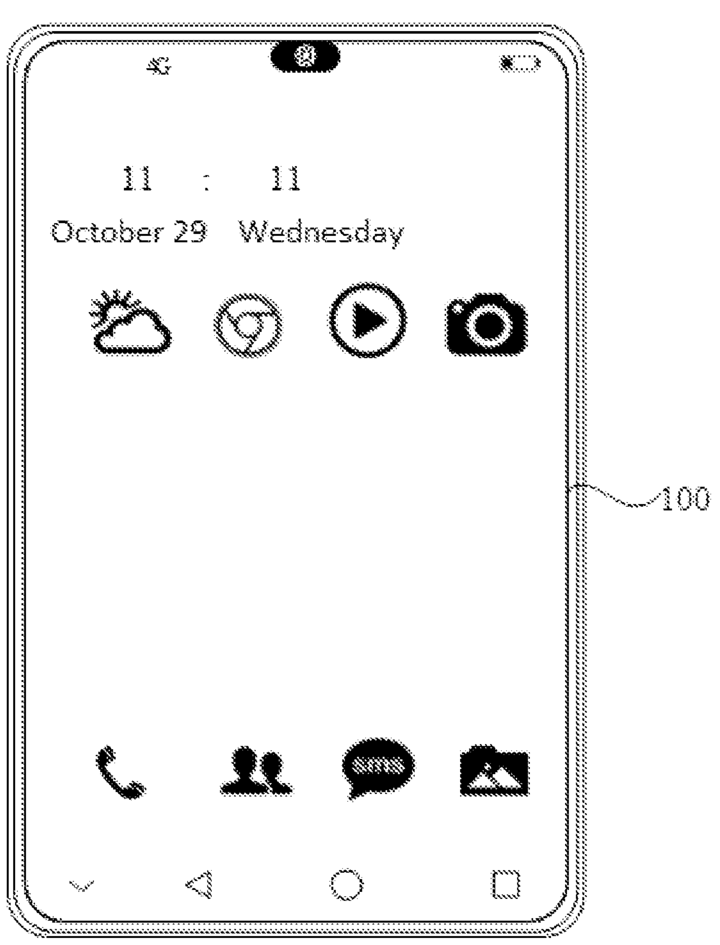

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term “comprise” and other forms thereof such as the third-person singular form “comprises” and the present participle form “comprising” are construed as open and inclusive, i.e., “including, but not limited to”. In the description of the specification, the terms such as “one embodiment”, “some embodiments”, “exemplary embodiments”, “example”, “specific example” or “some examples” are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as “first” and “second” are used for descriptive purposes only, and are not to be construed as indicating or implying the relative importance or implicitly indicating the number of indicated technical features. Thus, features defined with “first” or “second” may explicitly or implicitly include one or more of the features. In the description of the embodiments of the present disclosure, the term “a plurality of” or “the plurality of” means two or more unless otherwise specified.

In the description of some embodiments, the expressions “coupled” and “connected” and derivatives thereof may be used. The term “connected” should be understood in a broad sense. For example, the term “connected” may represent a fixed connection, a detachable connection, or connected as an integral body; the term “connected” may be directly “connected” or indirectly “connected” by an intermediate medium. For example, the term “connected” may be used in the description of some embodiments to indicate that two or more components are in direct physical or electrical contact with each other. For another example, the term “coupled” may be used in the description of some embodiments to indicate that two or more components are in direct physical or electrical contact. However, the term “coupled” or “communicatively coupled” may also mean that two or more components are not in direct contact with each other, but still cooperate or interact with each other. The embodiments disclosed herein are not necessarily limited to the content herein.

The phrase “at least one of A, B and C” has a same meaning as the phrase “at least one of A, B or C”, and they both include the following combinations of A, B and C: only A, only B, only C, a combination of A and B, a combination of A and C, a combination of B and C, and a combination of A, B and C.

The phrase “A and/or B” includes the following three combinations: only A, only B, and a combination of A and B.

As used herein, the term “if” is optionally construed as “when” or “in a case where” or “in response to determining that” or “in response to detecting”, depending on the context. Similarly, the phrase “if it is determined that” or “if [a stated condition or event] is detected” is optionally construed as “in a case where it is determined that” or “in response to determining that” or “in a case where [the stated condition or event] is detected” or “in response to detecting [the stated condition or event]”, depending on the context.

The phrase “applicable to” or “configured to” as used herein indicates an open and inclusive expression, which does not exclude apparatuses that are applicable to or configured to perform additional tasks or steps.

In addition, the use of the phrase “based on” is meant to be open and inclusive, since a process, step, calculation or other action that is “based on” one or more of the stated conditions or values may, in practice, be based on additional conditions or values exceeding those stated.

The term “about”, “substantially” or “approximately” as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as “parallel”, “perpendicular” or “equal” as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term “parallel” includes absolute parallelism and approximate parallelism, and an acceptable range of deviation of the approximate parallelism may be a deviation within 5°; the term “perpendicular” includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and areas of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

Some embodiments of the present disclosure provide a display apparatus. For example, the display apparatus may be a mobile phone, a tablet computer, a personal digital assistant (PDA), a television, an in-vehicle computer or a wearable display device. The specific form of the display apparatus is not specially limited in the embodiments of the present disclosure. For example, as shown in FIG. 1, the display apparatus 1000 is a mobile phone, and the display apparatus 1000 includes a display panel 100.

Figure 2:
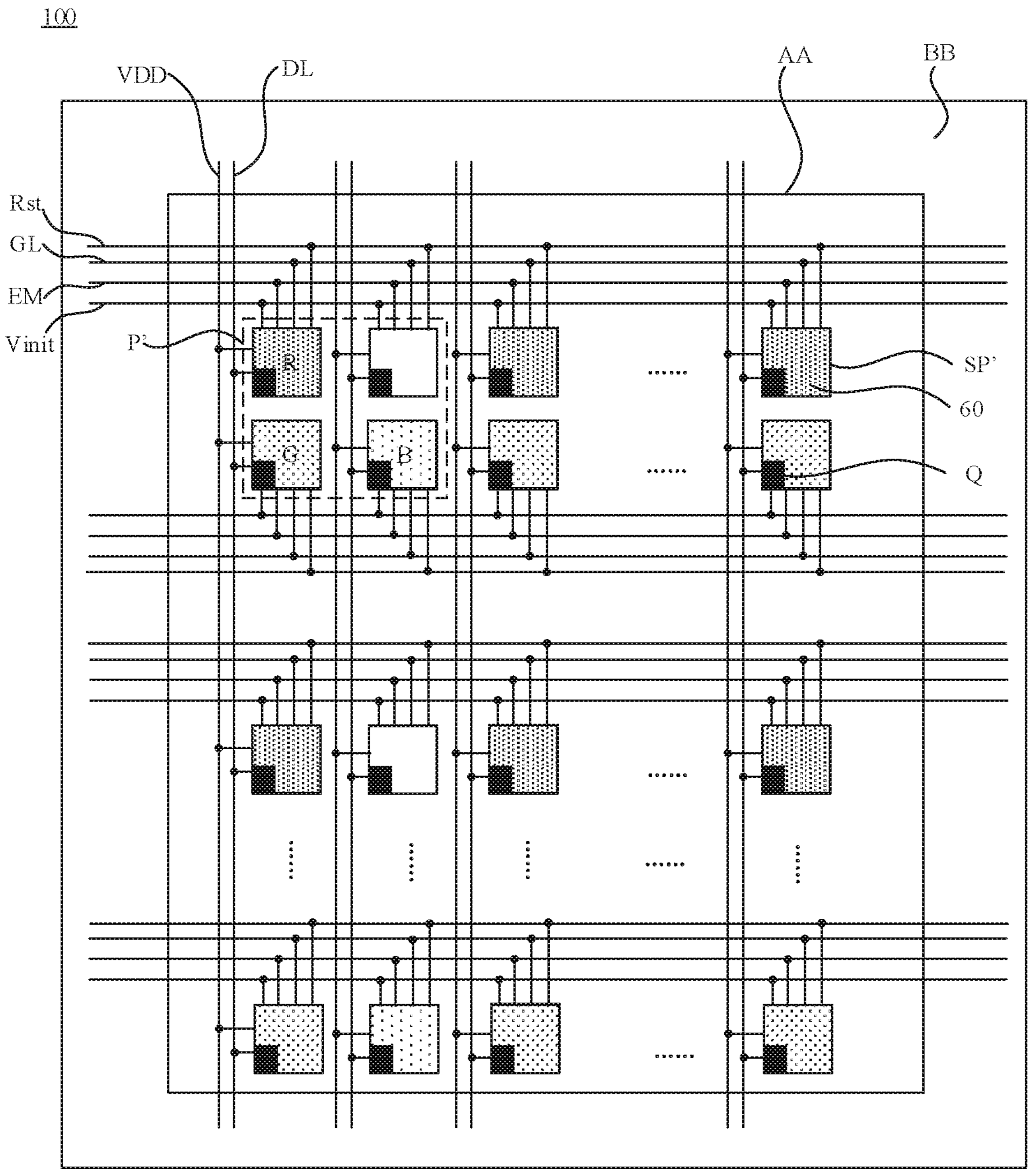
FIG. 2 is a structural diagram of a display panel, in accordance with some embodiments.

In some embodiments, as shown in FIG. 2, the display panel 100 includes a display area (also referred to as an active area or an active display area) AA and a peripheral area BB located on at least one side of the display area AA. The display area AA is provided therein with a plurality of pixels P' arranged in an array and a plurality of signal lines. Each pixel P' includes a plurality of sub-pixels SP'. The sub-pixel SP' is the smallest unit for the display panel 100 to display the image. Each sub-pixel SP' may display a single color, such as red (R), green (G) or blue (B). Adjusting brightness (gray scale) of sub-pixels SP' of different colors and performing combination and superposition of colors may achieve display of a plurality of colors, thereby realizing full-color display of the display panel 100.

In some embodiments, the sub-pixel SP' includes a light-emitting device and a pixel driving circuit 60 for driving the light-emitting device to emit light. All pixel driving circuits 60 in the display panel 100 are also arranged in an array.

The light-emitting device may use an organic light-emitting diode (OLED), a micro organic light-emitting diode (micro OLED), a quantum dot light-emitting diode (QLED), a mini light-emitting diode (mini LED), a micro light-emitting diode (micro LED), or the like.

The pixel driving circuit 60 may include a plurality of transistors and capacitor(s). For example, the transistors may be thin film transistors (TFTs), field effect transistors (e.g., oxide thin film transistors) or other switching devices with same properties, and the embodiments of the present disclosure are described by taking an example of the thin film transistors.

In the embodiments of the present disclosure, a control electrode of each transistor is a gate of the transistor, a first electrode thereof is one of a source and a drain of the transistor, and a second electrode thereof is the other of the source and the drain of the transistor. Since the source and the drain of the transistor may be symmetrical in structure, the source and the drain thereof may be structurally indistinguishable. That is, the first electrode and the second electrode of the transistor in the embodiments of the present disclosure may be indistinguishable in structure. For example, in a case where the transistor is a P-type transistor, the first electrode of the transistor is the source and the second electrode of the transistor is the drain. For example, in a case where the transistor is an N-type transistor, the first electrode of the transistor is the drain, and the second electrode of the transistor is the source.

In some embodiments, as shown in FIG. 2, the plurality of signal lines include a plurality of scan signal lines GL, a plurality of data lines DL, a plurality of reset signal lines Rst, a plurality of enable signal lines EM, a plurality of initialization signal lines Vinit, and a plurality of power supply voltage signal lines VDD. For example, the plurality of scan signal lines GL, the plurality of enable signal lines EM and the plurality of initialization signal lines Vinit are arranged in a row arrangement direction of sub-pixels SP', and the plurality of data lines DL and the plurality of power supply voltage signal lines VDD are arranged in a column arrangement direction of sub-pixels SP'. Each pixel driving circuit 60 is electrically connected to a scan signal line GL, a data line DL, a reset signal line, an enable signal line EM, an initialization signal line Vinit and a power supply voltage signal line VDD.

Figure 3:
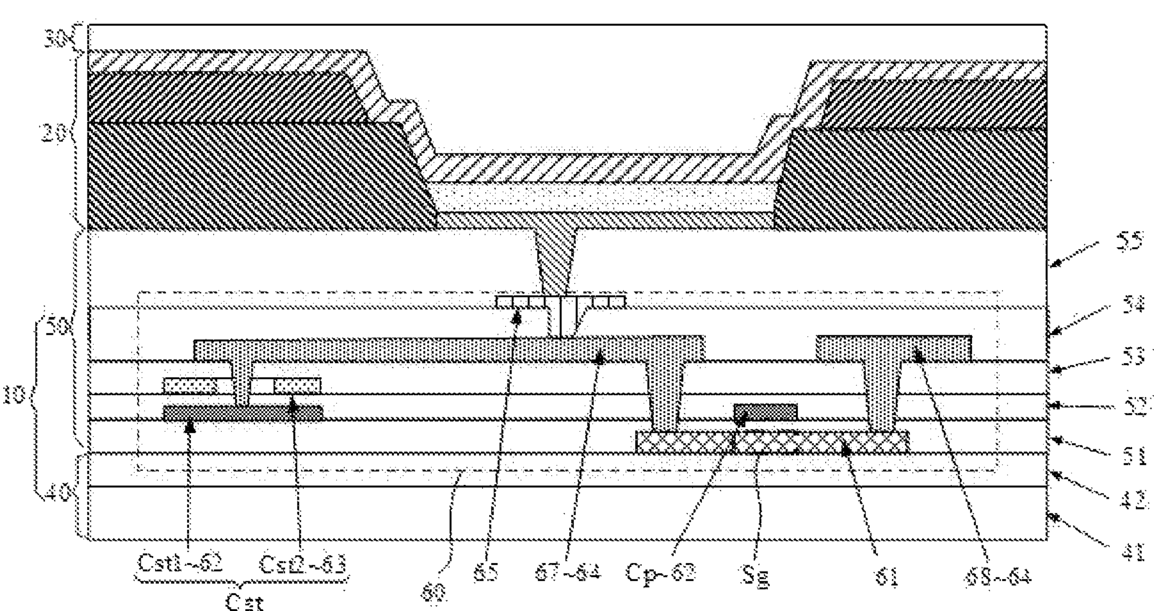
FIG. 3 is a partial cross-sectional view of a display panel, in accordance with some embodiments.

In some embodiments, as shown in FIG. 3, the display panel 100 includes an array substrate 10, a light-emitting device layer 20, and an encapsulation layer 30. The array substrate 10 includes a substrate 40 and a driving circuit layer 50 disposed on the substrate 40. The driving circuit layer 50 includes functional layers and insulating layers each located between adjacent functional layers. The functional layers may include an active layer 61, a first gate layer 62, a second gate layer 63, a first source-drain metal layer 64, and a second source-drain metal layer 65. The active layer 61, the first gate layer 62, the second gate layer 63 and the first source-drain metal layer 64 are used to form a plurality of pixel driving circuits 60 in the display panel 100. The light-emitting device layer 20 is disposed on a side of the driving circuit layer 50 away from the substrate 40. The encapsulation layer 30 is disposed on a side of the light-emitting device layer 20 away from the substrate 40.

In some examples, the substrate 40 may include a base 41 and a buffer layer 42. The base 41 may be a silicon base or may be made of a flexible material such as polyimide (PI) or saturated polyester (e.g., PET). The buffer layer 42 is provided on the base 41, and the driving circuit layer 50 is provided on a side of the buffer layer 42 away from the base 41.

In some examples, the driving circuit layer 50 may include the active layer 61 disposed on a side of the substrate 40, the first gate layer 62 disposed on a side of the active layer 61 away from the substrate 40, and the second gate layer 63 disposed on a side of the first gate layer 62 away from the substrate 40. The active layer 61 may use polysilicon (P—Si). The active layer 61 includes an active layer pattern of each transistor in the pixel driving circuit 60. The active layer pattern of each transistor includes a channel area Sg.

It will be noted that as shown in FIG. 3, the label "A~B" appearing in the figure indicates that a component A belongs to a component B, and the component A is a part of the component B. For example, "Cp~62" indicates that a gate pattern Cp belongs to the first gate layer 62, the first gate layer 62 includes the gate pattern Cp. As for similar labels appearing in other figures, please refer to this explanation.

In some embodiments, the pixel driving circuit 60 includes the plurality of transistors and the capacitor(s). The pixel driving circuit 60 may include a "6T1C" structure, a "7T1C" structure or a "6T2C" structure, where "T" is represented as a thin film transistor, the number in front of "T" is represented as the number of the thin film transistors, "C" is represented as a capacitor, and the number in front of "C" is represented as the number of the capacitor(s). The following will take the pixel driving circuit of the 7T1C mode as an example to introduce.

Figure 4:
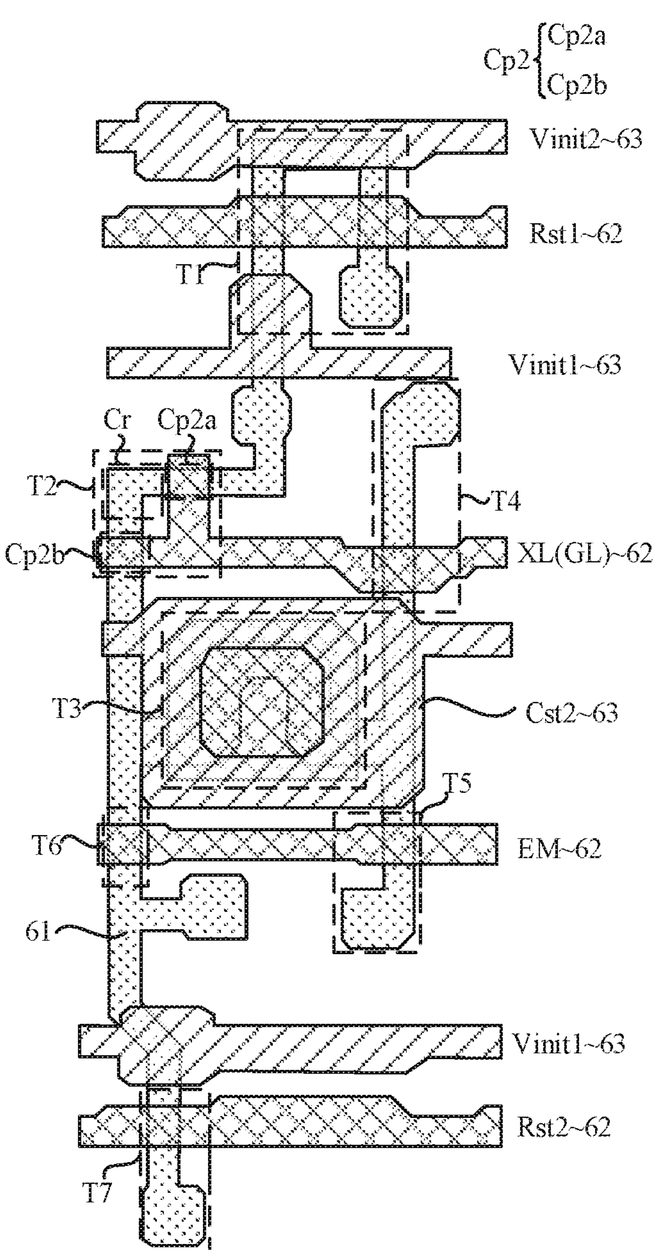
FIG. 4 is a structural diagram of an active layer, a first gate layer and a second gate layer, in accordance with some embodiments.
Figure 5:
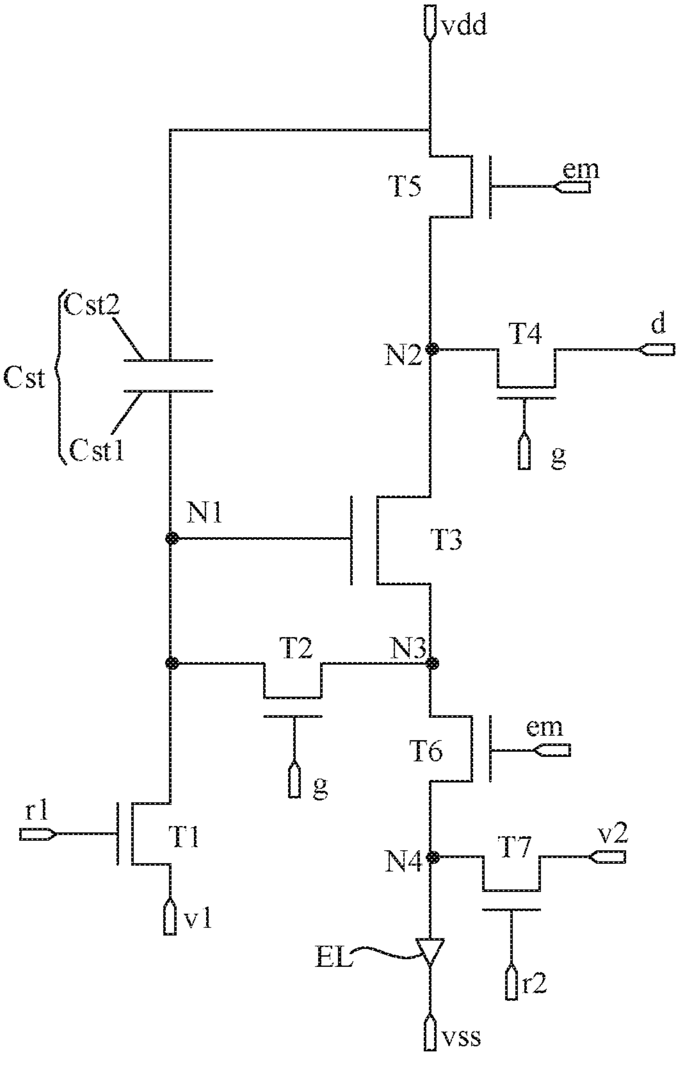
FIG. 5 is a circuit diagram of a pixel driving circuit, in accordance with some embodiments.

For example, as shown in FIGS. 4 and 5, FIG. 4 is a layout of the pixel driving circuit 60 of the 7T1C mode, and FIG. 5 is an equivalent circuit diagram of the pixel driving circuit 60 in FIG. 4. The pixel driving circuit 60 of the 7T1C mode includes a first reset transistor T1, a compensation transistor T2, a driving transistor T3, a writing transistor T4, a first enable transistor T5, a second enable transistor T6, a second reset transistor T7, and a capacitor Cst.

A control electrode of the first reset transistor T1 is electrically connected to a first reset signal terminal rl, a first electrode of the first reset transistor T1 is electrically connected to a first initialization signal terminal v1, and a second electrode of the first reset transistor T1 is electrically connected to a first node N1. The first reset signal terminal rl is electrically connected to a first reset signal line Rst1, and the first initialization signal terminal v1 is electrically connected to a first initialization signal line Vinit1.

A control electrode of the compensation transistor T2 is electrically connected to a scan signal terminal g, a first electrode of the compensation transistor T2 is electrically connected to a third node N3, and a second electrode of the compensation transistor T2 is electrically connected to the first node N1. The scan signal terminal g is electrically connected to a scan signal line GL.

A control electrode of the driving transistor T3 is electrically connected to the first node N1, a first electrode of the driving transistor T3 is electrically connected to a second node N2, and a second electrode of the driving transistor T3 is electrically connected to the third node N3.

A first electrode plate Cst1 of the capacitor Cst is electrically connected to the first node N1, a second electrode plate Cst2 of the capacitor Cst is electrically connected to a first voltage signal terminal vdd. The first voltage signal terminal vdd is electrically connected to a power supply voltage signal line VDD.

A control electrode of the writing transistor T4 is electrically connected to the scan signal terminal g, a first electrode of the writing transistor T4 is electrically connected to a data signal terminal d, and a second electrode of the writing transistor T4 is electrically connected to the second node N2. The data signal terminal d is electrically connected to a data line DL.

A control electrode of the first enable transistor T5 is electrically connected to a light-emitting control signal terminal em, a first electrode of the first enable transistor T5 is electrically connected to the first voltage signal terminal vdd, and a second electrode of the first enable transistor T5 is electrically connected to the second node N2. The light-emitting control signal terminal em is electrically connected to an enable signal lines EM.

A control electrode of the second enable transistor T6 is electrically connected to the light-emitting control signal terminal em, a first electrode of the second enable transistor T6 is electrically connected to the third node N3, and a second electrode of the second enable transistor T6 is electrically connected to an anode of a light-emitting device EL.

A control electrode of the second reset transistor T7 is electrically connected to a second reset signal terminal r2, a first electrode of the second reset transistor T7 is electrically connected to a second initialization signal terminal v2, and a second electrode of the second reset transistor T7 is electrically connected to a connection node N4 between the second electrode of the second enable transistor T6 and the anode of the light-emitting device EL. A cathode of the light-emitting device EL is electrically connected to a second voltage signal terminal vss. The second initialization signal terminal v2 is electrically connected to a second initialization signal line Vinit2, the second reset signal terminal r2 is electrically connected to a second reset signal line Rst2, and the second voltage signal terminal vss is electrically connected to a second voltage signal line. The second voltage signal line transmits a low-level signal, for example, a voltage of the low-level signal may be zero.

The specific working process of each transistor is as follows. In a data writing phase, the compensation transistor T2 and the writing transistor T4 are turned on under control of a scan signal received at the scan signal terminal g to write a data signal received at the data signal terminal d into the first node N1, so as to perform threshold voltage compensation on the driving transistor T3. When the compensation transistor T2 and the writing transistor T4 are turned off, a voltage at the first node N1 is a sum of a voltage of the data signal and a threshold voltage of the driving transistor T3. The voltage at the first node N1 can control a magnitude of a driving current passing through the driving transistor T3.

In a light-emitting phase, the compensation transistor T2 and the writing transistor T4 are turned off under the control of the scan signal, and the first enable transistor T5 and the second enable transistor T6 are turned on under control of an enable signal received at the light-emitting control signal terminal em. The driving transistor T3 is turned on to generate the driving current, and transmits the driving current to the light-emitting device EL. The light-emitting device EL emits light under control of the driving current. The magnitude of the driving current affects light-emitting brightness. That is to say, the voltage at the first node N1 may control the brightness of the light-emitting device EL, i.e., control the gray scale of the sub-pixel, thereby affecting the quality of the entire display image.

It will be noted that the first node N1, the second node N2 and the third node N3 in the embodiments of the present disclosure do not represent actual components, but represent junctions of relevant wiring connections in the layout of the pixel driving circuit 60. That is, the first node N1, the second node N2 and the third node N3 are nodes equivalent to the junctions of relevant wiring connections in the circuit diagram.

The following describes the layout corresponding to the pixel driving circuit. In the layout, each transistor includes an active layer pattern and a gate pattern. The active layer pattern is located in the active layer 61, the gate pattern is located in the first gate layer 62, and a source pattern and a drain pattern are located in the first source-drain metal layer 64.

Figure 6:
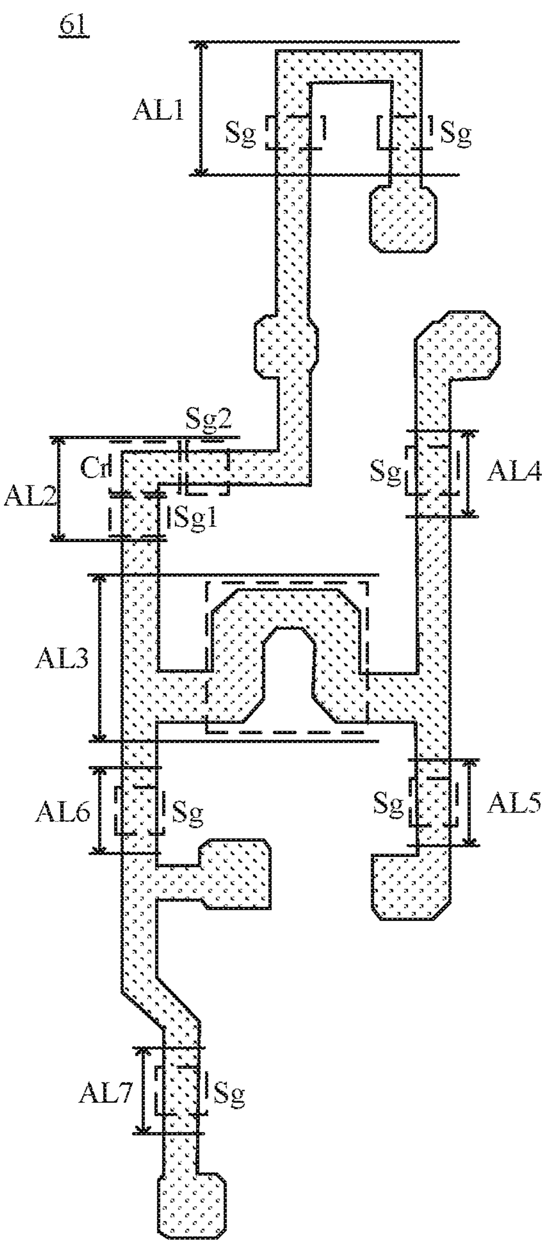
FIG. 6 is a structural diagram of an active layer, in accordance with some embodiments.

FIG. 6 illustrates an active layer pattern of each transistor included in a pixel driving circuit. For example, the active layer 61 at least includes a first active layer pattern AL1, a second active layer pattern AL2, a third active layer pattern AL3, a fourth active layer pattern AL4, a fifth active layer pattern AL5, a sixth active layer pattern AL6 and a seventh active layer pattern AL7.

In some embodiments, in the display area, multiple sub-pixels are arranged in an array, and the plurality of pixel driving circuits are also arranged in an array. The active layer 61 includes active layer patterns of all transistors in the plurality of pixel driving circuits. For example, only active layer patterns of seven transistors included in a pixel driving circuit are shown in FIG. 6. The active layer includes patterns replicated in an array of rows and columns in a unit of the active layer patterns of the transistors in the pixel driving circuit shown in FIG. 4.

Figure 7:
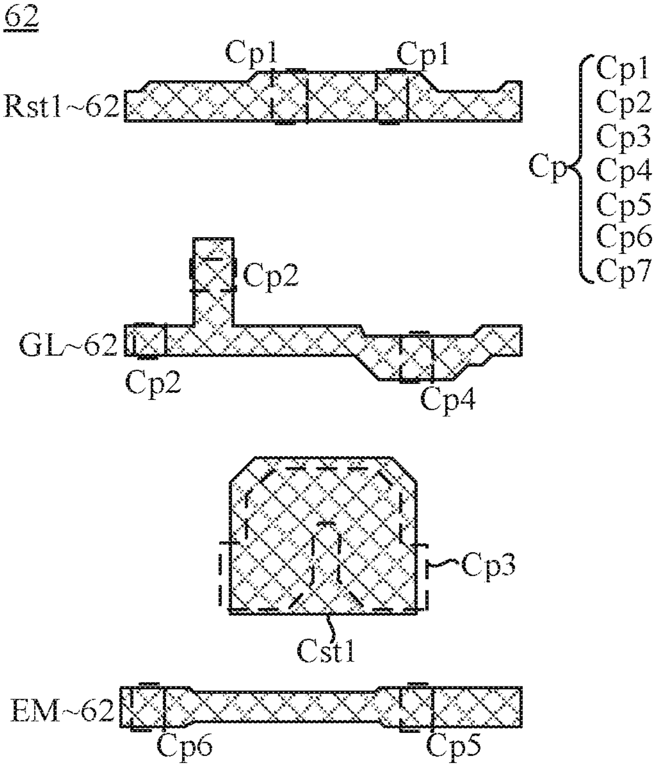
FIG. 7 is a structural diagram of a first gate layer, in accordance with some embodiments.
Figure 7:
Figure 8:
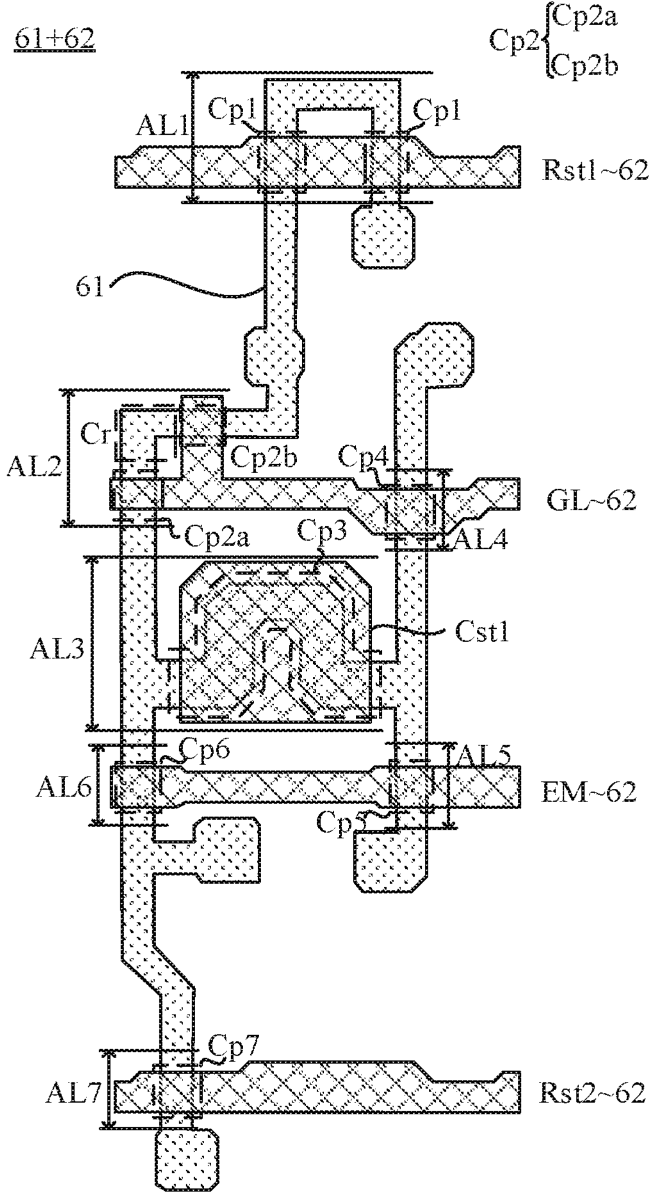
FIG. 8 is a structural diagram of an active layer and a first gate layer, in accordance with some embodiments.

The first gate layer 62 and the second gate layer 63 include a plurality of signal lines. As shown in FIGS. 7 and 8, the first gate layer 62 includes signal lines and the first electrode plate Cst1 of the capacitor, and the signal lines may be, for example, the scan signal lines GL, the first reset signal lines Rst1, the second reset signal lines Rst2, and the enable signal lines EM. The signal lines located in the first gate layer 62 and the first electrode plate Cst1 of the capacitor pass through active layer patterns of all transistors in the pixel driving circuit, and portions of the signal lines located in the first gate layer 62 and the first electrode plate Cst1 of the capacitor overlapped with the active layer patterns of all the transistors are gate patterns Cp of the transistors.

For example, as shown in FIG. 8, the first reset signal line Rst1 passes through the first active layer pattern AL1, and a portion of the first reset signal line Rst1 overlapped with the first active layer pattern AL1 is a first gate pattern Cp1.

The scan signal line GL passes through the second active layer pattern AL2 and the fourth active layer pattern AL4. A portion of the scan signal line GL overlapped with the second active layer pattern AL2 is a second gate pattern Cp2. A portion of the scan signal line GL overlapped with the fourth active layer pattern AL4 is a fourth gate pattern Cp4.

The first electrode plate Cst1 passes through the third active layer pattern AL3, and a portion of the first electrode plate Cst1 overlapped with the third active layer pattern AL3 is a third gate pattern Cp3.

The enable signal line EM passes through the fifth active layer pattern AL5 and the sixth active layer pattern AL6. A portion of the enable signal line EM overlapped with the fifth active layer pattern AL5 is a fifth gate pattern Cp5. A portion of the enable signal line EM overlapped with the sixth active layer pattern AL6 is a sixth gate pattern Cp6.

The second reset signal line Rst2 passes through the seventh active layer pattern AL7, and a portion of the second reset signal line Rst2 overlapped with the seventh active layer pattern AL7 is a seventh gate pattern Cp7.

Figure 9:
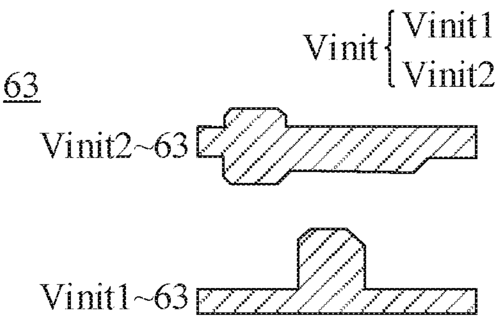
FIG. 9 is a structural diagram of a second gate layer, in accordance with some embodiments.
Figure 9:
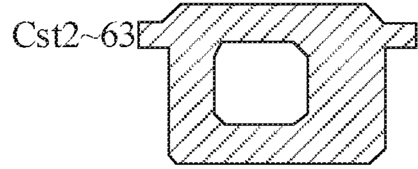
Figure 9:
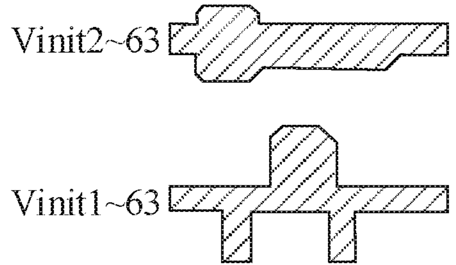

In some embodiments, as shown in FIG. 9, the second gate layer 63 includes signal lines and the second electrode plate Cst2 of the capacitor, and the signal lines include initialization signal lines Vinit.

It will be noted that "passing through" in the present disclosure means that an orthographic projection of the former on the substrate overlaps with an orthographic projection of the latter on the substrate. For example, each signal line in the first gate layer 62 passing through an active layer pattern of a corresponding transistor refers to that an orthographic projection of each signal line such as the scan signal line GL in the first gate layer 62 on the substrate overlaps with an orthographic projection of the second active layer pattern AL2 on the substrate.

In some embodiments, some transistors in the pixel driving circuit are double-gate thin film transistors. For example, the active layer pattern of the double-gate thin film transistor is the second active layer pattern AL2 as shown in FIG. 6. The active layer pattern of the double-gate thin film transistor includes two channel areas (a first channel area Sg1 and a second channel area Sg2), and a conductive area Cr located between the two channel areas. As shown in FIG. 4, the double-gate thin film transistor has two second gate patterns Cp2: a first second gate pattern Cp2*a* and a second second gate pattern Cp2*b*. The orthographic projections of the two second gate patterns Cp2 on the substrate respectively correspond to the two channel areas, and the two second gate patterns Cp2 receive the same signal. For example, two portions of a first gate signal line pass through the active layer pattern of the double-gate thin film transistor, the first gate signal line is located in the first gate layer 62, and the two portions of the first gate signal line are the two second gate patterns Cp2 of the double-gate thin film transistor. At a position where the first gate signal line passes through the active layer pattern of the double-gate thin film transistor for the first time, a portion of the active layer pattern of the double-gate thin film transistor (the second active layer pattern AL2) overlapped with the first gate signal line is the first channel area. At a position where the first gate signal line passes through the active layer pattern of the double-gate thin film transistor for the second time, a portion of the active layer pattern of the double-gate thin film transistor (the second active layer pattern AL2) overlapped with the first gate signal line again is the second channel area. A portion of the active layer pattern of the double-gate thin film transistor between the first channel area and the second channel area is the conductive area Cr, and an orthographic projection of the conductive area Cr on the substrate does not overlap with an orthographic projection of each signal line in the first gate layer 62 on the substrate.

In some examples, the compensation transistor T2 is a double-gate thin film transistor, and the active layer pattern of the compensation transistor T2 is the active layer pattern of the double-gate thin film transistor. For example, the active layer pattern AL2 of the compensation transistor shown in FIG. 4 is the active layer pattern of the double-gate thin film transistor. As shown in FIG. 4, the active layer 61 includes the active layer pattern of the compensation transistor T2, the active layer pattern of the compensation transistor T2 includes two channel areas (a first channel area and a second channel area) and a conductive area Cr located between the two channel areas, and the conductive area Cr connects the two channel areas. The first gate layer 62 includes a first gate signal line XL. An orthographic projection of the first gate signal line XL on the substrate overlaps with orthographic projections of the two channel areas on the substrate. A portion of the first gate signal line XL overlapped with the first channel area of the active layer pattern of the compensation transistor T2 is a first second gate pattern Cp2*a*, and a portion of the first gate signal line XL overlapped with the second channel area of the active layer pattern of the compensation transistor T2 is a second second gate pattern Cp2*b*. The first gate signal line XL may be, for example, the scan signal line GL.

The conductive area Cr of the compensation transistor T2 may produce voltage fluctuations when affected by an external electric field or signal. During the voltage fluctuations of the conductive area Cr, the channel areas Sg may produce electric leakage due to the influence of the voltage across the conductive area Cr. Further, the compensation transistor T2 has electric leakage in the pixel driving circuit 60, the voltage at the first node N1 produce voltage fluctuations due to the electric leakage of the compensation transistor T2, and the driving transistor T3 is affected by the voltage at the first node N1 to produce fluctuations in the driving current, resulting in unstable light-emitting brightness of the light-emitting device, thereby causing an decrease in the quality of the display image of the display panel 100.

Figure 10:
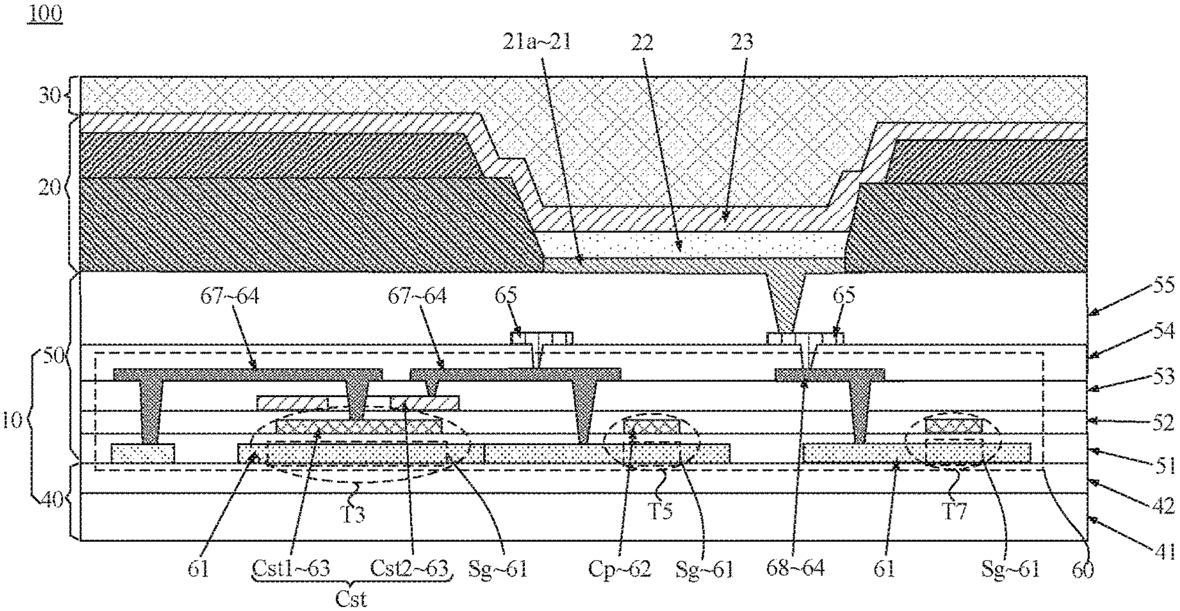
FIG. 10 is a partial cross-sectional view of another display panel, in accordance with some embodiments.

In light of this, in an aspect, some embodiments of the present disclosure provide an array substrate 10. As shown in FIG. 10, the array substrate 10 includes a substrate 40, an active layer 61, a first gate layer 62 and a second gate layer 63. The positions of all film layers in the array substrate 10 are consistent with the positions in the above embodiments, and will not be repeated here.

Figure 11:
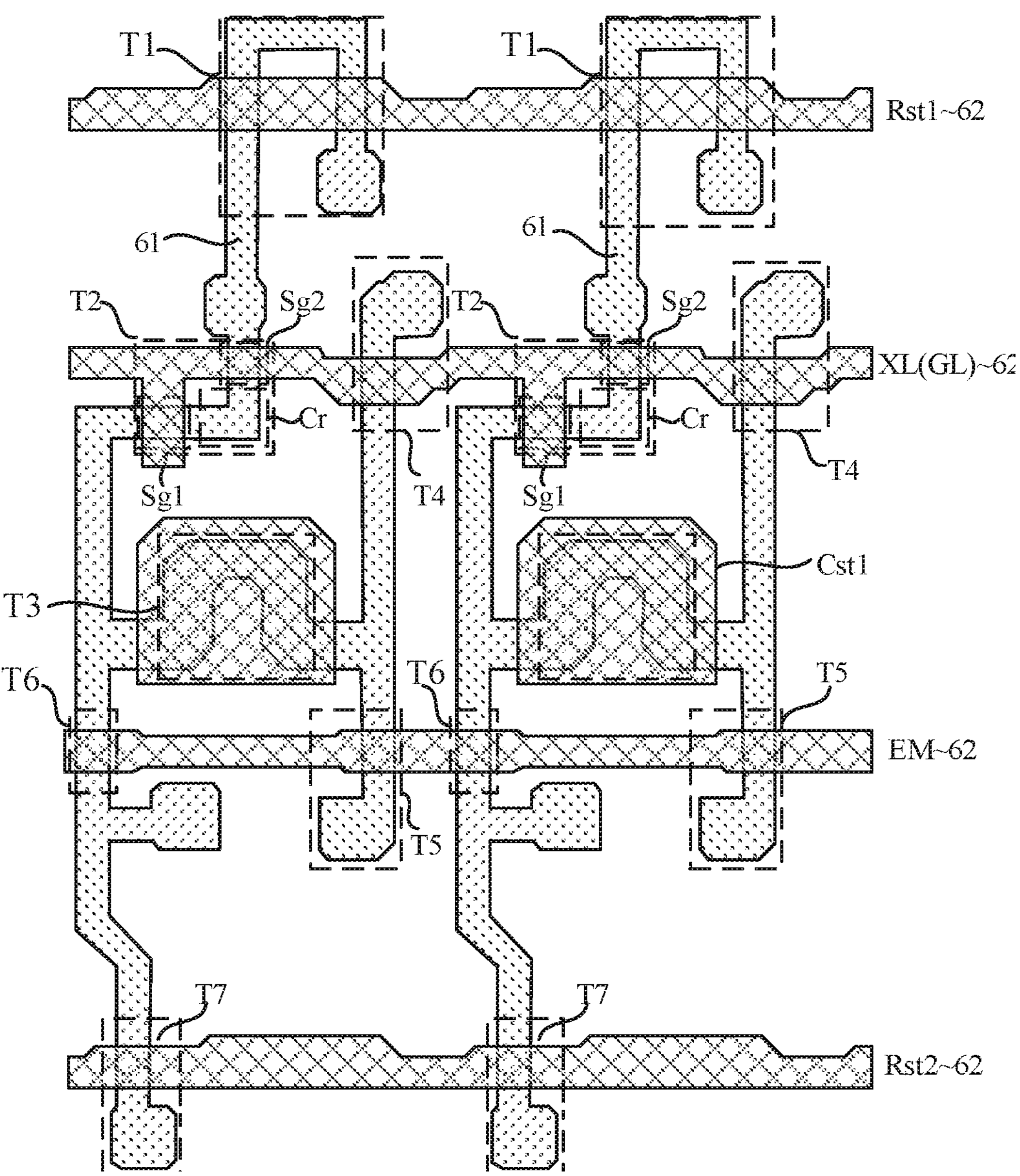
FIG. 11 is a structural diagram of another active layer and another first gate layer, in accordance with some embodiments.

As shown in FIG. 11, the array substrate 10 includes a plurality of pixel driving circuits arranged in an array, and the pixel driving circuit 60 at least includes a compensation transistor T2.

Figure 12:
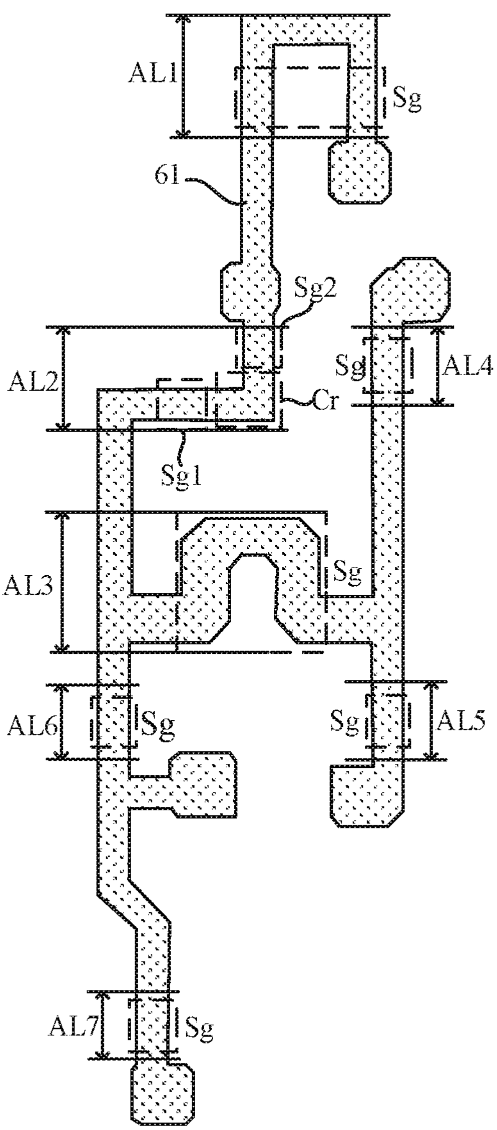
FIG. 12 is a structural diagram of another active layer, in accordance with some embodiments.

As shown in FIG. 12, taking the pixel driving circuit of "7T1C" as an example, the active layer includes: an active layer pattern of a first reset transistor (a first active layer pattern AL1), an active layer pattern of a compensation transistor (a second active layer pattern AL2), an active layer pattern of a driving transistor (a third active layer pattern AL3), an active layer pattern of a writing transistor (a fourth active layer pattern AL4), an active layer pattern of a first enable transistor (a fifth active layer pattern AL5), an active layer pattern of a second enable transistor (a sixth active layer pattern AL6), and an active layer pattern of a second reset transistor (a seventh active layer pattern AL7).

The film structure of the compensation transistor T2 is introduced below.

Figure 13:
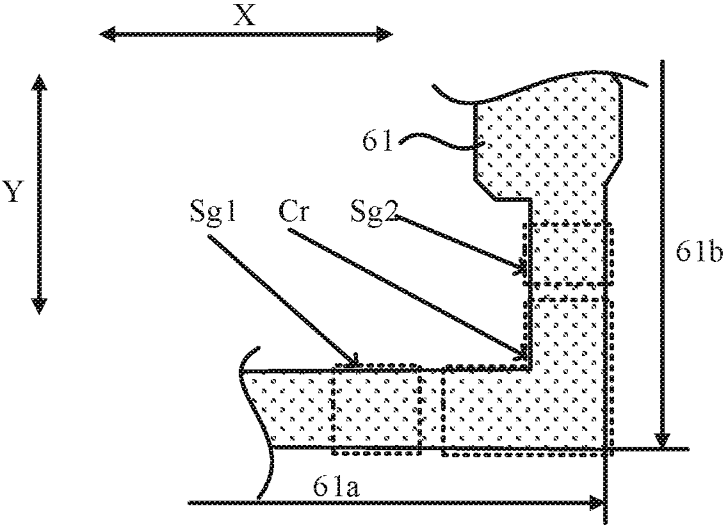
FIG. 13 is a partial structural diagram of another active layer, in accordance with some embodiments.

In some embodiments, as shown in FIG. 13, the active layer pattern of the compensation transistor (the second active layer pattern AL2) includes two channel areas, and the two channel areas include a first channel area Sg1 and a second channel area Sg2. The active layer pattern of the compensation transistor includes a first pattern 61*a* and a second pattern 61*b* that are connected. The first pattern 61*a* extends in a first direction X, and the second pattern 61*b* extends in a second direction Y. The first direction X intersects the second direction Y. For example, the first direction X is perpendicular to the second direction Y, the first channel area Sg1 is located in the first pattern 61*a*, the second channel area Sg2 is located in the second pattern 61*b*, and a conductive area Cr is provided in a connection portion between the first pattern 61*a* and the second pattern 61*b*.

In some examples, the first pattern 61*a* and the second pattern 61*b* of the active layer pattern of the compensation transistor form a bent shape, for example, the pattern is in an "L" shape. A portion of the first pattern 61*a* overlapped with a first gate signal line XL is the first channel area Sg1. The first gate signal line XL overlapped with the first pattern 61*a* also overlaps with the second pattern 61*b*. A portion of the second pattern 61*b* overlapped with the first gate signal line XL is the second channel area Sg2. The connection portion between the first pattern 61*a* and the second pattern 61*b* is the conductive area Cr, or in other words, a portion of the active layer 61 between the first channel area Sg1 and the second channel area Sg2 is the conductive area Cr. There is no overlap between the conductive area Cr and the first gate signal line XL or between the conductive area Cr and the first electrode plate Cst1.

Figure 14:
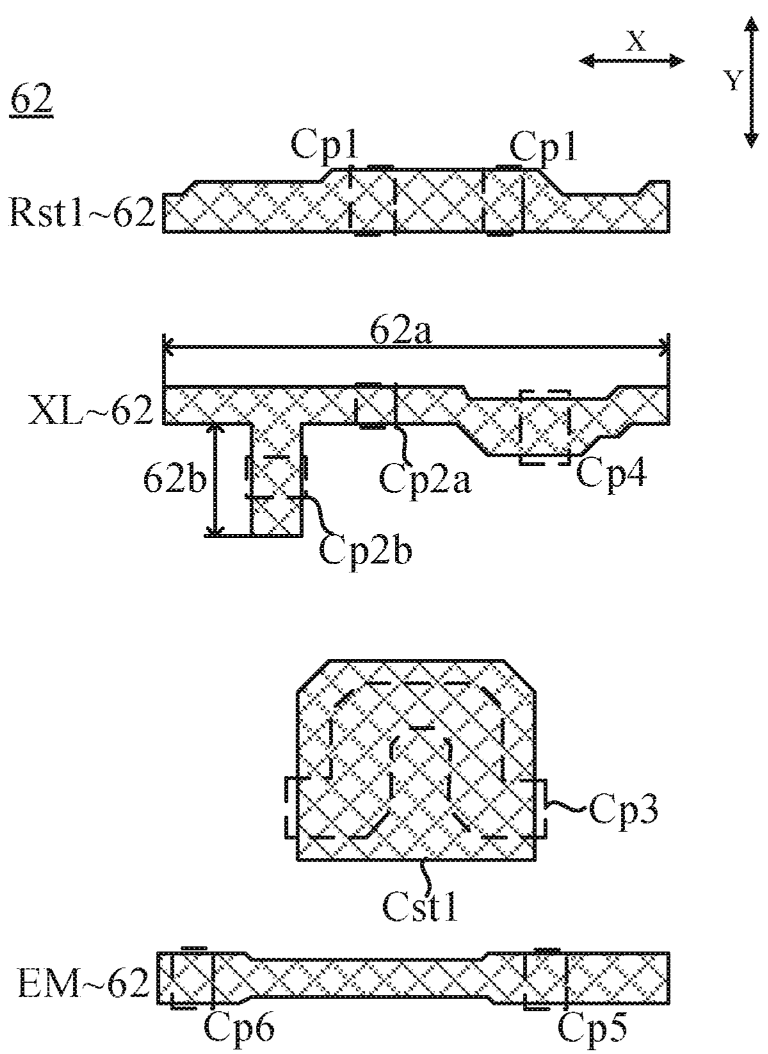
FIG. 14 is a structural diagram of another first gate layer, in accordance with some embodiments.
Figure 14:
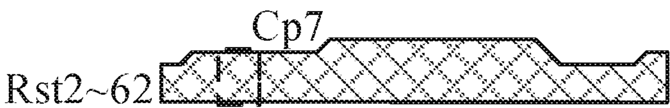
Figure 15:
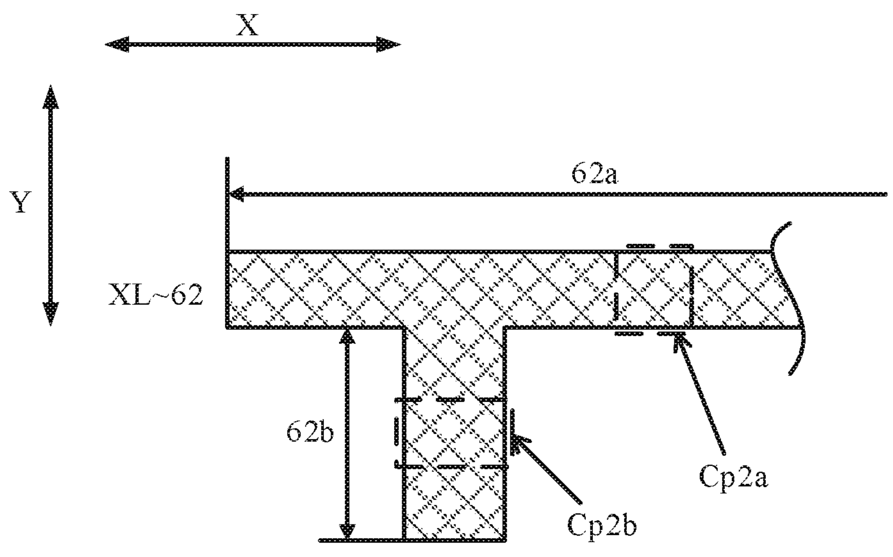
FIG. 15 is a partial structural diagram of another first gate layer, in accordance with some embodiments.
Figure 16:
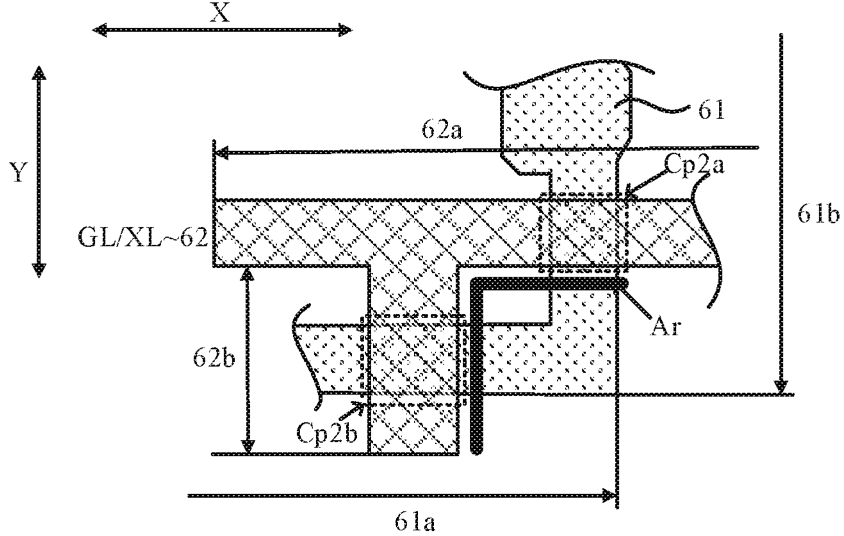
FIG. 16 is a partial structural diagram of another active layer and another first gate layer, in accordance with some embodiments.

In some embodiments, as shown in FIGS. 14, 15 and 16, the first gate signal line XL includes a first gate signal main line 62*a* and at least one first extension portion 62*b* connected to the first gate signal main line 62*a*. The first gate signal main line 62*a* extends in the first direction X, and the first extension portion 62*b* extends in the second direction Y. An orthographic projection of the first gate signal main line 62*a* on the substrate overlaps with an orthographic projection of the second pattern 61*b* on the substrate, and an orthographic projection of the first extension portion 62*b* on the substrate overlaps with an orthographic projection of the first pattern 61*a* on the substrate.

In some examples, as shown in FIG. 16, the first gate signal line XL may be, for example, a scan signal line GL. The scan signal line GL includes the first gate signal main line 62*a* extending in the first direction X and the first extension portion 62*b* extending in the second direction Y. The first gate signal main line 62*a* passes through the second pattern 61*b*, and a portion of the first gate signal main line 62*a* overlapped with the second pattern 61*b* is a first second gate pattern Cp2*a* of the double-gate thin film transistor. The first extension portion 62*b* passes through the first pattern 61*a*, and a portion of the first extension portion 62*b* overlapped with the first pattern 61*a* is a second second gate pattern Cp2*b* of the double-gate thin film transistor.

In some embodiments, as shown in FIG. 16, the orthographic projection of the first gate signal main line 62*a* on the substrate 40 and the orthographic projection of the first extension portion 62*b* on the substrate 40 form at least one corner Ar, and an opening of the corner Ar is close to the first electrode plate.

As shown in FIGS. 11, 12 and 16, the active layer includes the active layer pattern of the compensation transistor T2, that is, the second active layer pattern AL2 in the figures. The difference between the active layer pattern of the compensation transistor T2 in FIGS. 11 and 12 and the active layer pattern of the compensation transistor T2 in FIGS. 6 and 8 is that an orthographic projection of the conductive area Cr on the substrate 40 is located on a side of an orthographic projection of the first gate signal line XL on the substrate proximate to an orthographic projection of the active layer pattern (the third active layer pattern AL3) of the driving transistor T3 on the substrate, and on a side of the orthographic projection of the first gate signal line XL on the substrate proximate to an orthographic projection of the active layer pattern (the fourth active layer pattern AL4) of the writing transistor T4 on the substrate. That is, the relative position of the conductive area Cr changes, so as to facilitate providing a voltage stabilizing pattern mentioned below.

Figure 17:
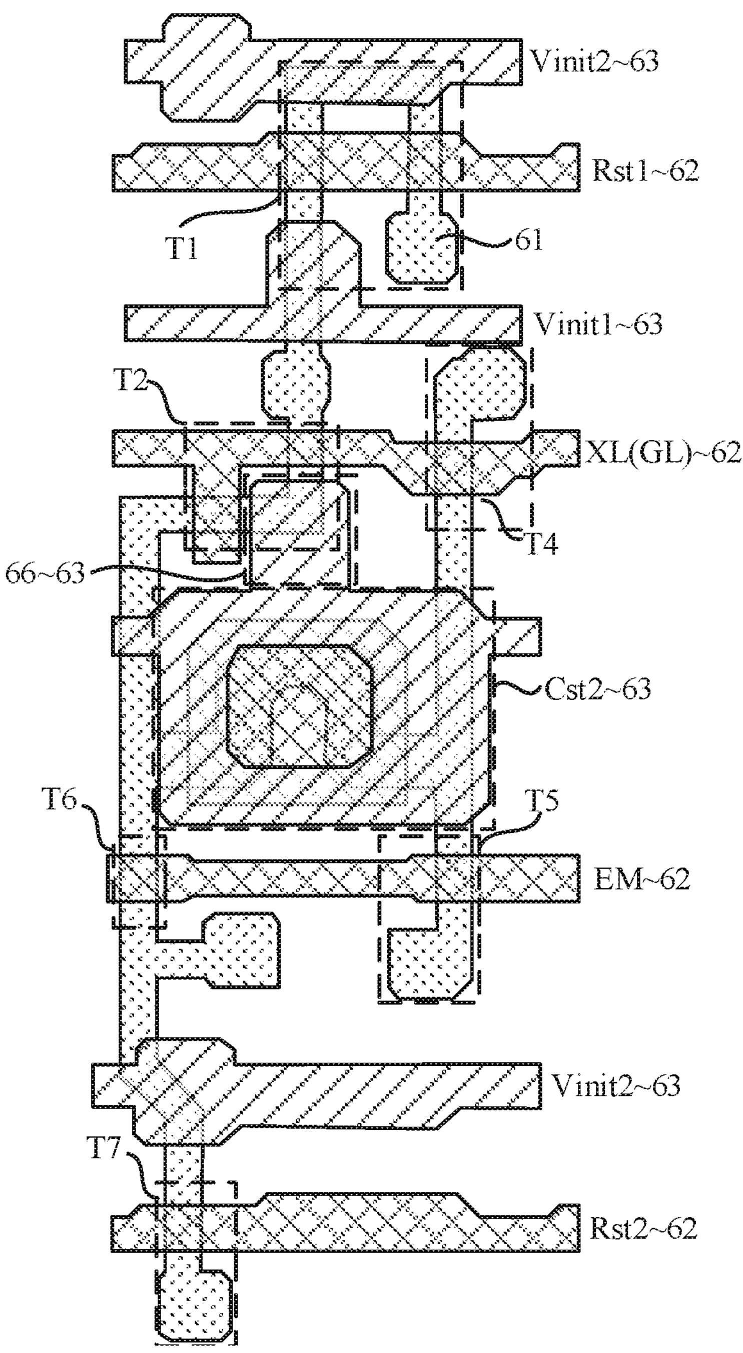
FIG. 17 is a structural diagram of another active layer, another first gate layer and another second gate layer, in accordance with some embodiments.
Figure 18:
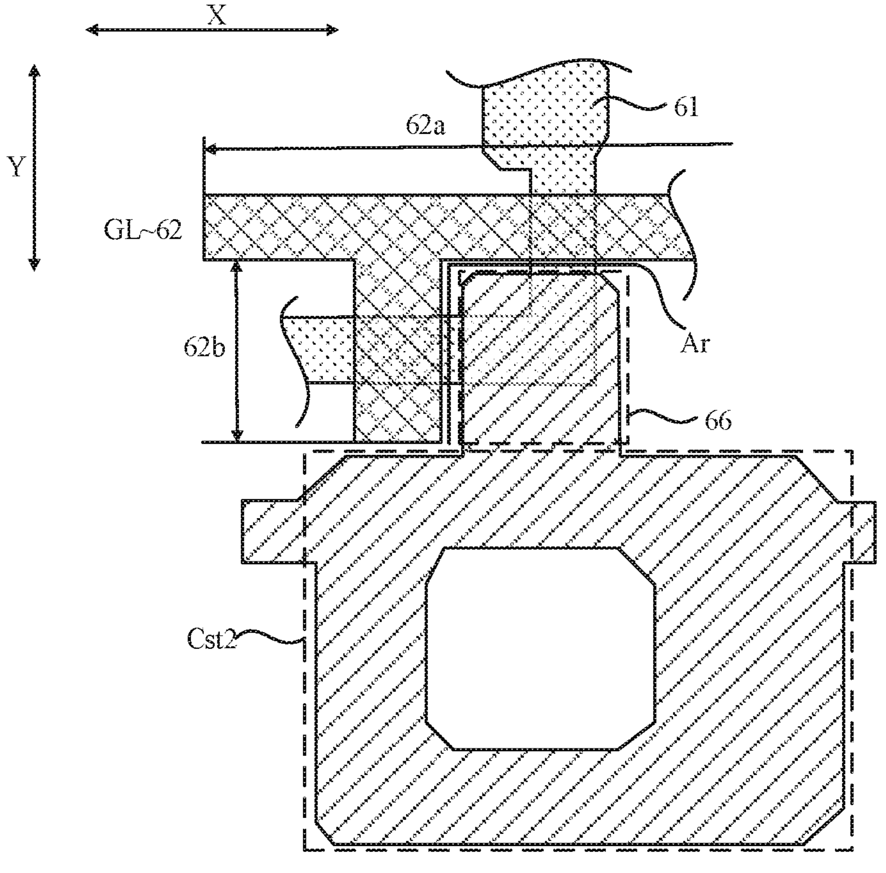
FIG. 18 is a partial structural diagram of another active layer, another first gate layer and another second gate layer, in accordance with some embodiments.

As shown in FIGS. 17 and 18, the second gate layer 63 includes a voltage stabilizing pattern 66, and the stabilizing pattern 66 is configured to receive a power supply voltage signal, and an orthographic projection of the voltage stabilizing pattern 66 on the substrate 40 overlaps with an orthographic projection of the conductive area of the active layer pattern of the compensation transistor T2 on the substrate 40. The orthographic projection of the voltage stabilizing pattern 66 on the substrate 40 is located on an inner side of the corner Ar.

In some examples, the voltage stabilizing pattern 66 is located in the second gate layer 63, and the voltage stabilizing pattern 66 overlaps with the conductive area in the active layer 61, which is equivalent to that the voltage stabilizing pattern 66 and the conductive area Cr of the active layer pattern of the compensation transistor T2 form a capacitor. The voltage stabilizing pattern 66 receives the power supply voltage signal, so as to maintain a stable voltage. The conductive area of the compensation transistor T2 overlapped with the voltage stabilizing pattern 66 has weakened voltage fluctuations due to the influence of the stable voltage when affected by external factors. Furthermore, the conductive area may maintain a stable voltage. Correspondingly, the voltage across two ends of the first channel area and the second channel area that are connected to the conductive area may have a weakened change. When the compensation transistor T2 is turned off, there will not be a relatively large voltage difference between the first electrode and the second electrode, so that the electric leakage of the double-gate thin film transistor may be reduced, and control quality of the driving current of the pixel driving circuit 60 may be improved. Accordingly, the quality of the display image of the display panel 100 may be improved.

The structural design of the active layer pattern of the compensation transistor T2 and the first gate signal line XL makes the compensation transistor T2 a double-gate transistor. The first gate signal line XL overlaps with both the first channel area Sg1 and the second channel area Sg2 of the active layer pattern of the compensation transistor T2, and does not overlap with the conductive area Cr. This is equivalent to that the first gate signal line XL exposes the conductive area Cr. The voltage stabilizing pattern 66 overlaps with the exposed conductive area and will not interfere with the first gate signal line XL.

The opening of the corner Ar faces the second electrode plate Cst2, that is, the first extension portion 62*b* extends in the second direction Y and is provided close to the second electrode plate Cst2, which facilitates exposing the conductive area Cr and facilitates providing the voltage stabilizing pattern 66 electrically connected to the second electrode plate Cst2. The voltage stabilizing pattern 66 is disposed on an inner side of the corner Ar, an overall size of the layout of the pixel driving circuit 60 may be kept constant, a pixel size of the display panel is not affected, and clarity of the image of the display panel 100 may remain unchanged.

Figure 25:
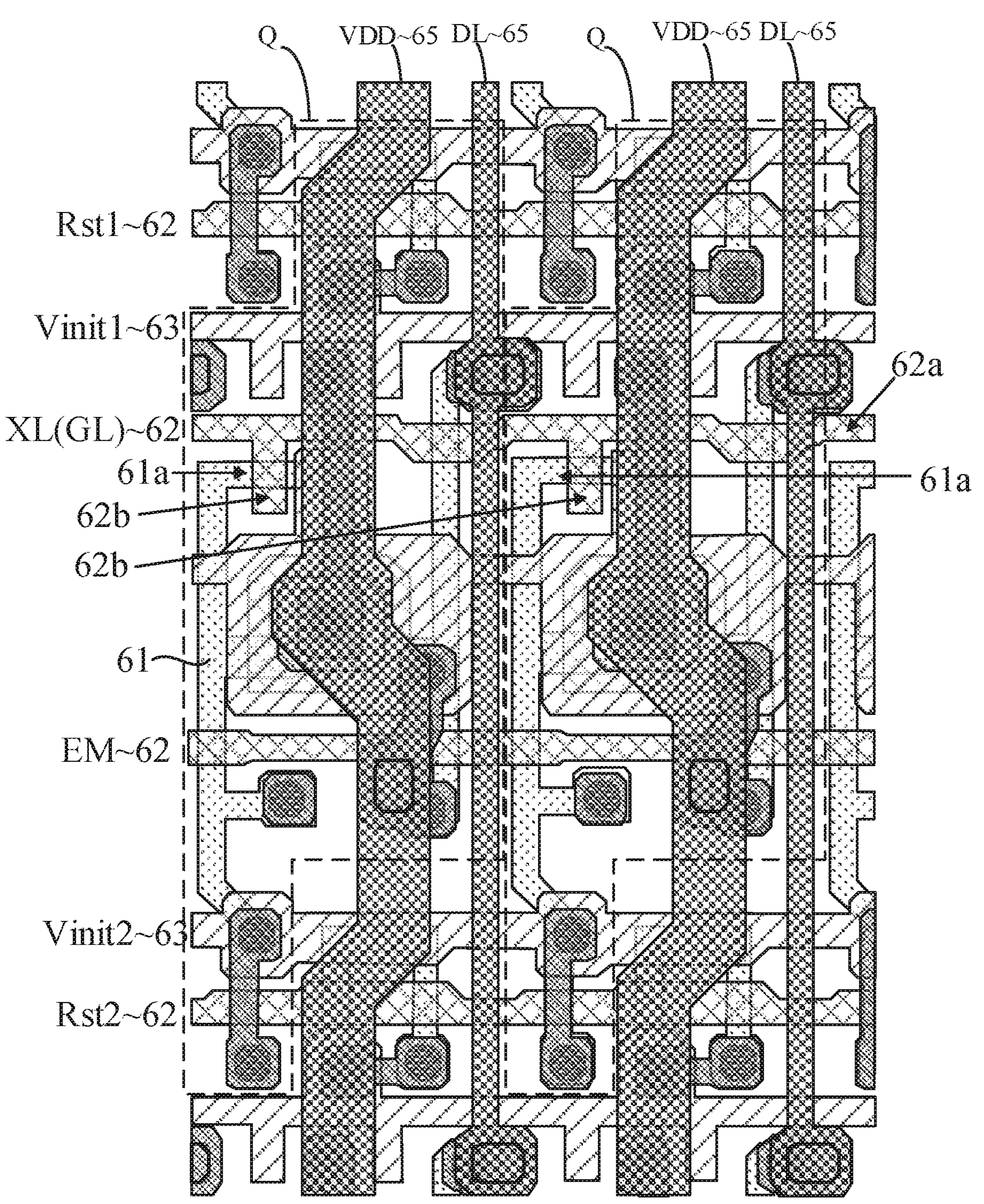
FIG. 25 is a structural diagram of array arrangement for another pixel driving circuit, in accordance with some embodiments.

Referring to FIG. 25, a first gate signal line XL includes a first gate signal main line 62*a* and a plurality of first extension portions 62*b*. A first extension portion 62*b* corresponds to a first pattern 61*a* of a compensation transistor in a pixel driving circuit.

It will be noted that FIGS. 4 to 8 and 12 to 24 introduce patterns of all film layers by taking an area (referred to as a pixel unit) where a single pixel driving circuit is located as an example. In the display area, the multiple sub-pixels are arranged in an array, and the plurality of pixel driving circuits are also arranged in an array. In each pixel unit, the patterns of all the film layers are as shown in FIG. 20. FIG. 11 shows a structural diagram of the active layer and the first gate layer in the two pixel units. As shown in FIG. 25, an area Q framed by a dotted box becomes an area where a pixel driving circuit is located. FIG. 25 illustrates a film structure diagram of two pixel units. It can be seen that a pattern of each film layer is arranged in a periodic pattern.

In some examples, as shown in FIG. 3 or 10, the driving circuit layer 50 further includes a first source-drain metal layer 64, and the first source-drain metal layer 64 includes a plurality of connection ends 68 and a plurality of connection patterns 67.

In some examples, the array substrate 10 further includes a first insulating layer 51 provided between the active layer 61 and the first gate layer 62, a second insulating layer 52 provided between the first gate layer 62 and the second gate layer 63, a third insulating layer 53 provided on a side of the second gate layer 63 away from the substrate 40, the first source-drain metal layer 64 provided on a side of the third insulating layer 53 away from the substrate 40, and a fourth insulating layer 54 provided on a side of the first source-drain metal layer 64 away from the substrate 40. The first insulating layer 51, the second insulating layer 52, the third insulating layer 53 and the fourth insulating layer 54 insulate all the functional layers from each other. A planarization layer is also provided on a side of the fourth insulating layer 54 away from the substrate 40, and the light-emitting device layer 20 is provided on a side of the planarization layer 55 away from the substrate 40.

In some examples, the array substrate 10 further includes a second source-drain metal layer 65 provided on a side of the fourth insulating layer 54 away from the substrate 40. The second source-drain metal layer 65 includes data lines and power supply voltage signal lines.

Figure 19:
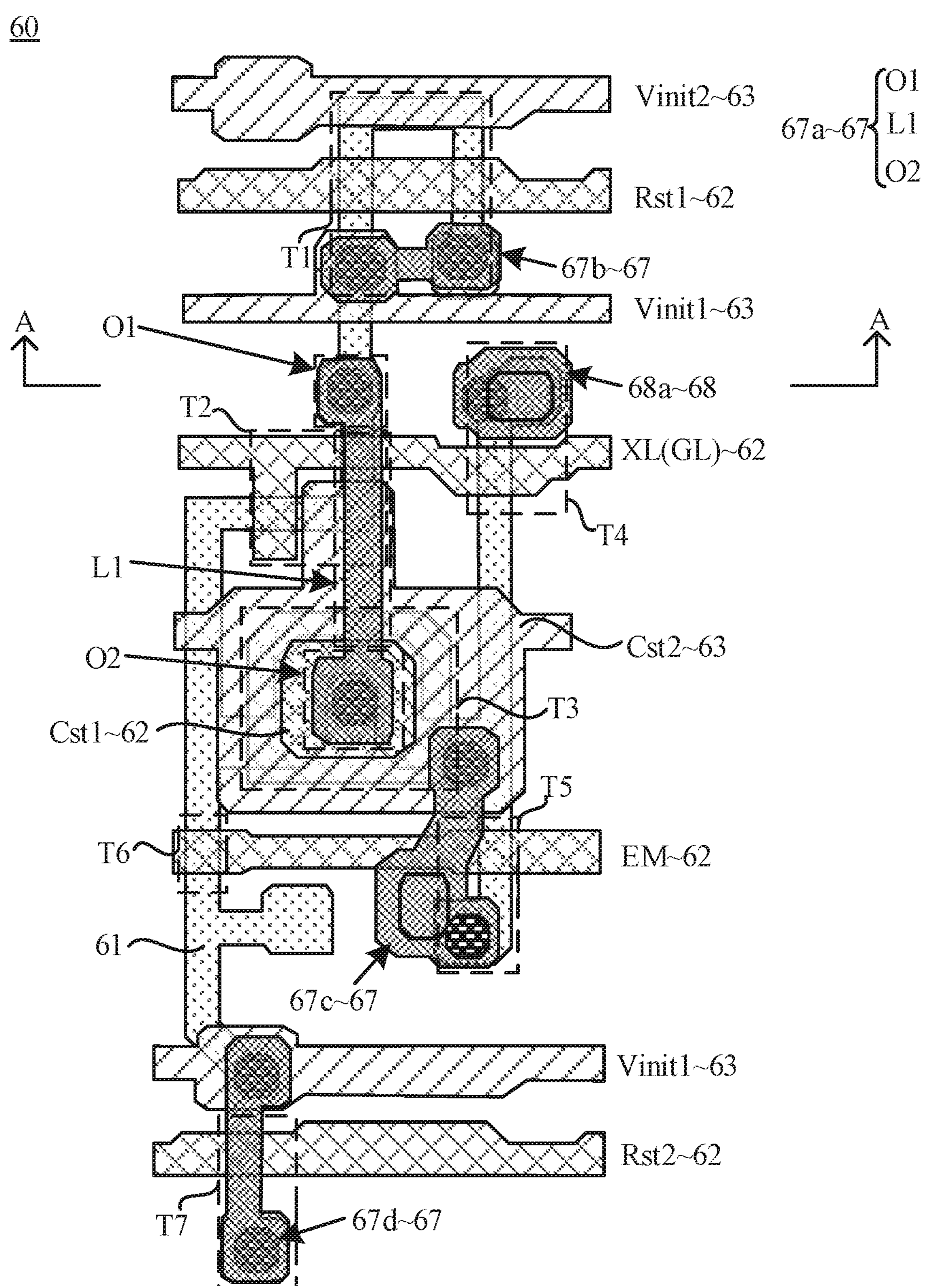
FIG. 19 is a structural diagram of another pixel driving circuit, in accordance with some embodiments.
Figure 20:
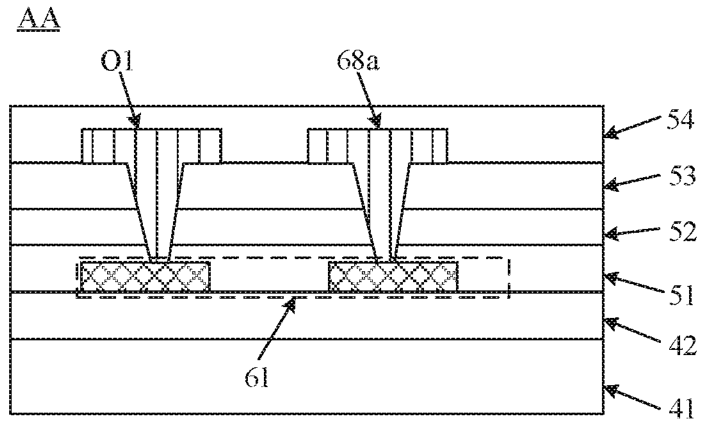
FIG. 20 is a cross-sectional view taken along an A-A direction in FIG. 19.

In some embodiments, as shown in FIGS. 4 and 19, active layer patterns of some transistors in the pixel driving circuit 60 are electrically connected to signal lines in the first gate layer 62 and/or the second gate layer 63, the first electrode plate Cst1 and the second electrode plate Cst2 by connection patterns 67, and active layer patterns of some transistors in the pixel driving circuit 60 are electrically connected to the data lines and the power supply voltage signal lines by the connection ends 68.

In some embodiments, the pixel driving circuit 60 further includes a writing transistor T4. A first electrode of the writing transistor T4 is electrically connected to a data signal terminal (the data line). The first electrode plate Cst1 is electrically connected to the second electrode of the compensation transistor T2. The first electrode of the writing transistor T4 is electrically connected to the data line by the connection end 68, and the first electrode plate Cst1 is electrically connected to the second electrode of the compensation transistor T2 by the connection pattern 67. The connection patterns 67 include a first connection pattern 67*a*, which is used to connect the first electrode plate Cst1 and the second electrode of the compensation transistor T2. The connection ends 68 include a first connection end 68*a*, which is used to connect the first electrode of the writing transistor T4 and the data line. The first source-drain metal layer 64 includes the first connection end 68*a* and the first connection pattern 67*a*.

As shown in FIGS. 19 and 20, FIG. 20 is a cross-sectional view of the pixel driving circuit 60 shown in FIG. 19 taken along the A-A direction. The first connection end 68*a* is electrically connected to the active layer 61 through a via hole extending through the first insulating layer 51, the second insulating layer 52 and the third insulating layer 53. For example, the active layer 61 further includes an active layer pattern of the writing transistor T4, and the first connection end 68*a* is connected to the active layer pattern of the writing transistor T4. The first connection end 68*a* penetrates the via hole in the first insulating layer 51, the second insulating layer 52 and the third insulating layer 53 to be connected to the active layer pattern of the writing transistor T4. In addition, the data line is connected to the first connection end 68*a* through a via hole extending through the fourth insulation layer 54.

The first connection pattern 67*a* includes a first end O1, a first connection line L1 and a second end O2 that are connected in sequence. The first end O1 of the first connection pattern 67*a* is connected to the active layer pattern of the compensation transistor T2, and the second end O2 of the first connection pattern 67*a* is connected to the first electrode plate Cst1 of the capacitor. The first end O1 is connected to the active layer 61 through a via hole extending through the first insulation layer 51, the second insulation layer 52 and the third insulation layer 53. For example, the first end O1 is connected to the active layer pattern of the compensation transistor T2 through the via hole extending through the first insulating layer 51, the second insulating layer 52 and the third insulating layer 53, and the second end O2 is connected to the first electrode plate Cst1 through a via hole extending through the second insulating layer 52 and the third insulating layer 53. The first end O1 and the second end O2 are electrically connected by the first connection line L1 located in the first source-drain metal layer.

In some embodiments, as shown in FIGS. 19 and 20, in the layout of the pixel driving circuit 60, the first connection end 68*a* is located on a side of the first end O1. In the pixel driving circuits 60 arranged in an array, a plurality of first connection ends 68*a* and a plurality of first ends O1 are alternately arranged in a certain direction. For example, the plurality of first connecting ends 68*a* and the plurality of first ends O1 are alternately arranged in the first direction X.

The first connection end 68*a* is configured to receive a signal from the data line. The voltage at the first connection end 68*a* changes with a waveform of a signal transmitted by the data line. An electric field is formed at the first connection end 68*a*, and the electric field affects the first end O1. The first end O1 is electrically connected to the first electrode plate Cst1 of the capacitor by the first connection line L1 and the second end O2. The first end O1 is affected by the electric field and generates voltage fluctuations, and the voltage of the first electrode plate Cst1 changes accordingly, so that the voltage storage function of the capacitor may be affected, and the capacitor produce electric leakage.

The first connection pattern 67*a* connects the active layer pattern of the compensation transistor T2 and the first electrode plate Cst1, and a portion of the first electrode plate Cst1 overlapped with the active layer pattern of the driving transistor T3 serves as the gate pattern of the driving transistor. This is equivalent to that the first connection pattern 67*a* connects the active layer pattern of the compensation transistor T2, the first electrode plate Cst1 of the capacitor Cst and the gate pattern of the driving transistor T3. The first connection pattern 67*a* serves as a junction of the three, and the junction is represented by the first node N1 in the equivalent circuit diagram in FIG. 5. That is, the voltage of the first end O1 is the voltage at the first node N1. If the voltage at the first node N1 fluctuates, the driving current of the driving transistor T3 will fluctuate, and the light-emitting brightness of the light-emitting device EL connected to the pixel driving circuit 60 will be unstable, resulting in color distortion of the display image of display panel 100 and decrease in the quality of the display image.

Figure 21:
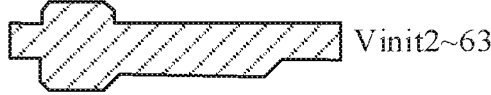
FIG. 21 is a structural diagram of another, in accordance with some embodiments.
Figure 21:
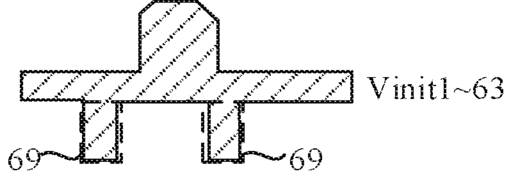
Figure 21:
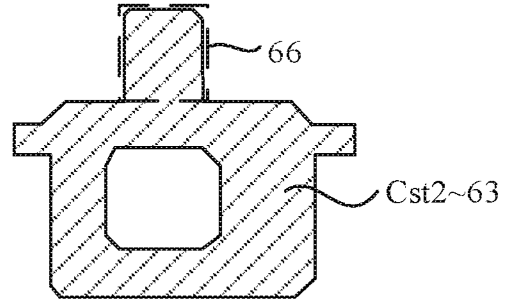
Figure 21:
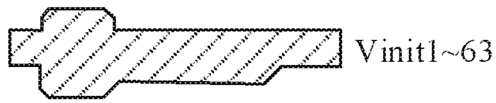
Figure 22:
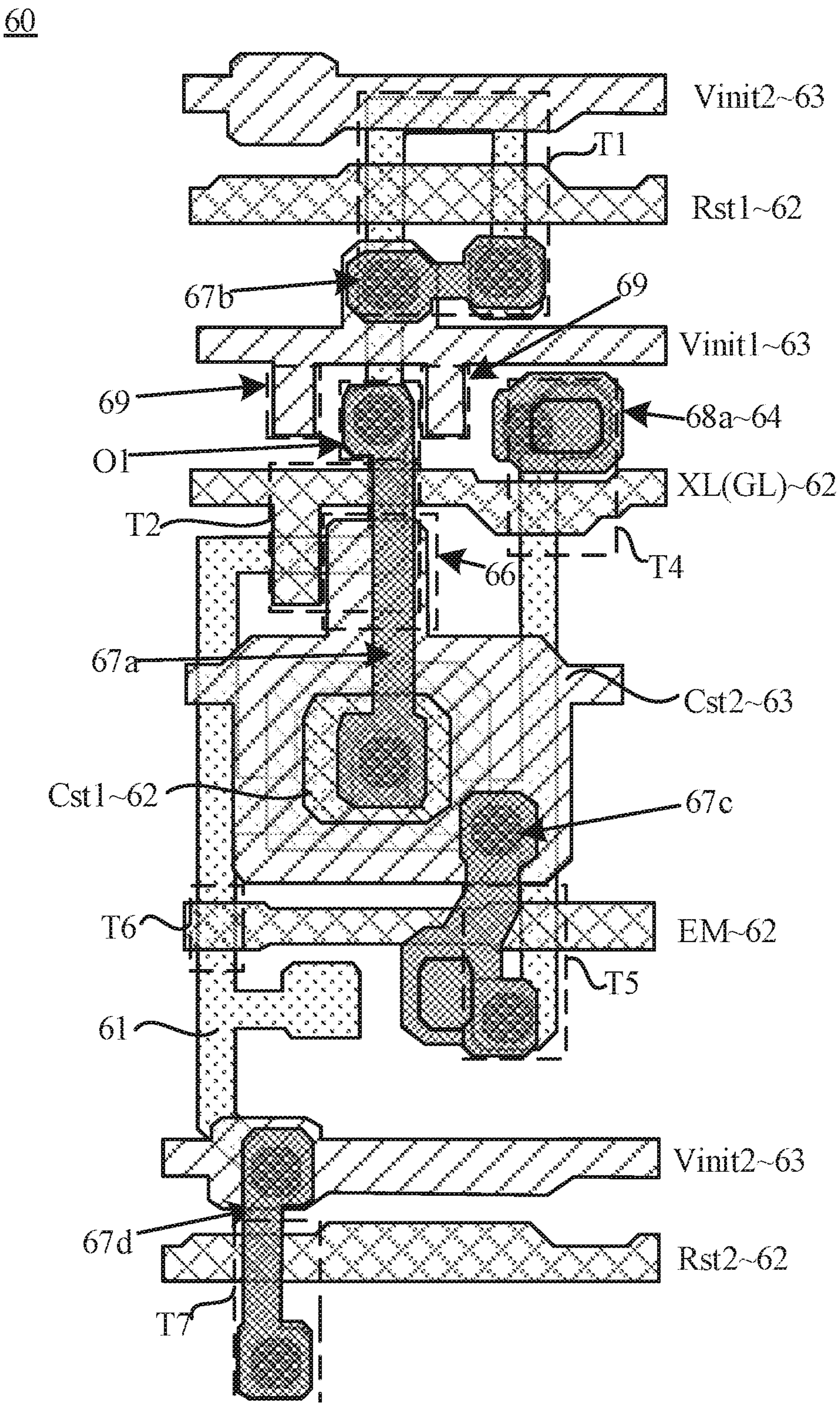
FIG. 22 is a structural diagram of a pixel driving circuit, in accordance with some embodiments.

Based on this, as shown in FIGS. 21 and 22, the second gate layer 63 of the array substrate 10 provided by the embodiments of the present disclosure, in addition to the voltage stabilizing pattern 66, further includes at least one shielding pattern 69. An orthographic projection of the shielding pattern 69 on the substrate is located between a first connection end 68*a* and a first end O1 of a first connection pattern 67*a* that are adjacent. The shielding pattern 69 is configured to receive a constant voltage signal.

In some examples, the shielding pattern 69 isolates the electric field generated by the first connection end 68*a* from the first end O1. In the pixel driving circuits 60 arranged in an array, every adjacent first connection end 68*a* and first end O1 are provided with a shielding pattern 69 therebetween. Further, each first end O1 is provided with a shielding pattern 69 on each of both sides thereof in the first direction. Thus, an orthographic projection of the first end O1 on the substrate is located between orthographic projections of the two shielding patterns 69 on the substrate.

The shielding patterns 69 isolate the influence of the external electric field on the first end O1 and improve the voltage stability of the first end O1. That is, the voltage at the first node N1 is stable, the light-emitting brightness of the light-emitting device corresponding to the first node N1 is stable, the display panel may have high color fidelity, and the display image may have high quality.

In some embodiments, as shown in FIGS. 21 and 22, the second gate layer 63 further includes initialization signal lines Vinit1/Vinit2, and a shielding pattern 69 is connected to an initialization signal line.

For example, the initialization signal line transmits an initialization signal, which is a constant voltage signal. The shielding pattern 69 is connected to the initialization signal line to be provided with a stable voltage. Moreover, the initialization signal line and the shielding pattern 69 are both located in the second gate layer 63, which facilitates the connection between the shielding pattern 69 and the initialization signal line, and is conducive to the shielding pattern 69 producing a good electric field shielding effect on the first end O1.

In some embodiments, as shown in FIGS. 21 and 22, the initialization signal lines include a first initialization signal line Vinit1, and the first initialization signal line Vinit1 is connected to the shielding patterns 69.

For example, in the layout of the pixel driving circuit 60, the initialization signal lines include the first initialization signal line Vinit1, and the first end O1 is provided close to the first initialization signal line Vinit1. Therefore, the shielding patterns 69 are connected to the first initialization signal line Vinit1.

In some embodiments, as shown in FIG. 22, the pixel driving circuit 60 further includes a first reset transistor T1, and the active layer 61 further includes an active layer pattern of the first reset transistor T1. The first initialization signal line Vinit1 is electrically connected to the active layer pattern of the first reset transistor T1.

Figure 23:
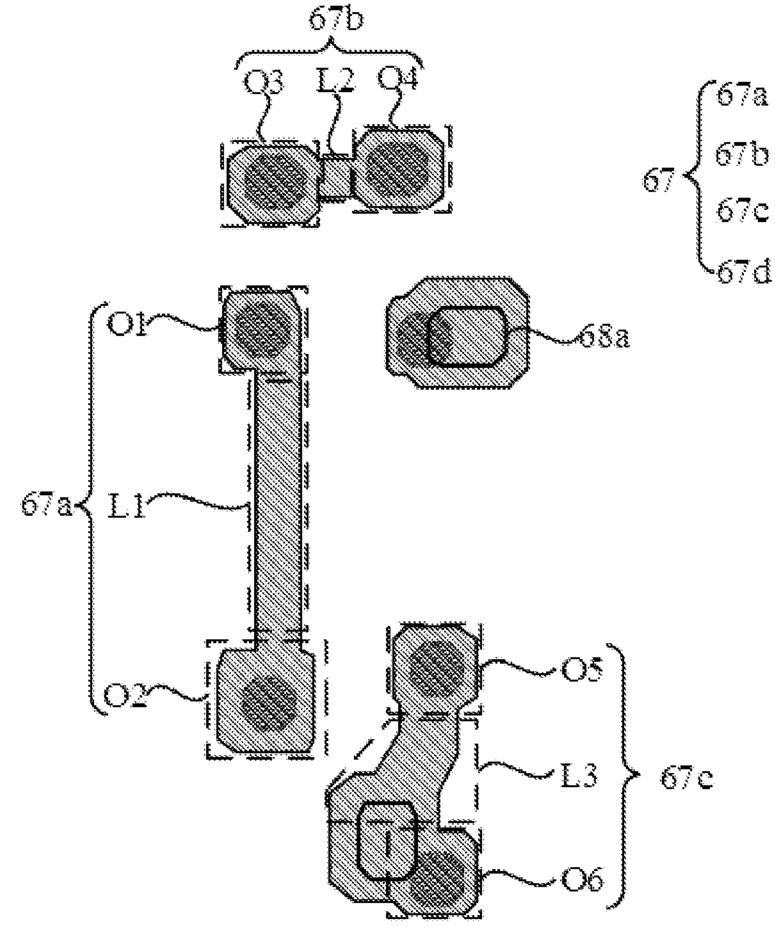
FIG. 23 is a structural diagram of a first metal layer, in accordance with some embodiments.
Figure 23:
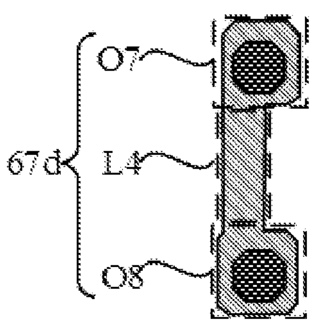

For example, as shown in FIGS. 22 and 23, the connection patterns 67 located in the first source-drain metal layer 64 further include a second connection pattern 67*b*. The second connection pattern 67*b* includes a third end O3, a second connection line L2 and a fourth end O4 that are connected in sequence. The third end O3 is connected to the first initialization signal line Vinit1 through a via hole extending through the third insulating layer, and the fourth end O4 is connected to the active layer pattern of the first reset transistor through a via hole extending through the first insulating layer, the second insulating layer and the third insulating layer. The third end O3 and the fourth end O4 are electrically connected by the second connection line L2 located in the first source-drain metal layer 64.

Figure 24:
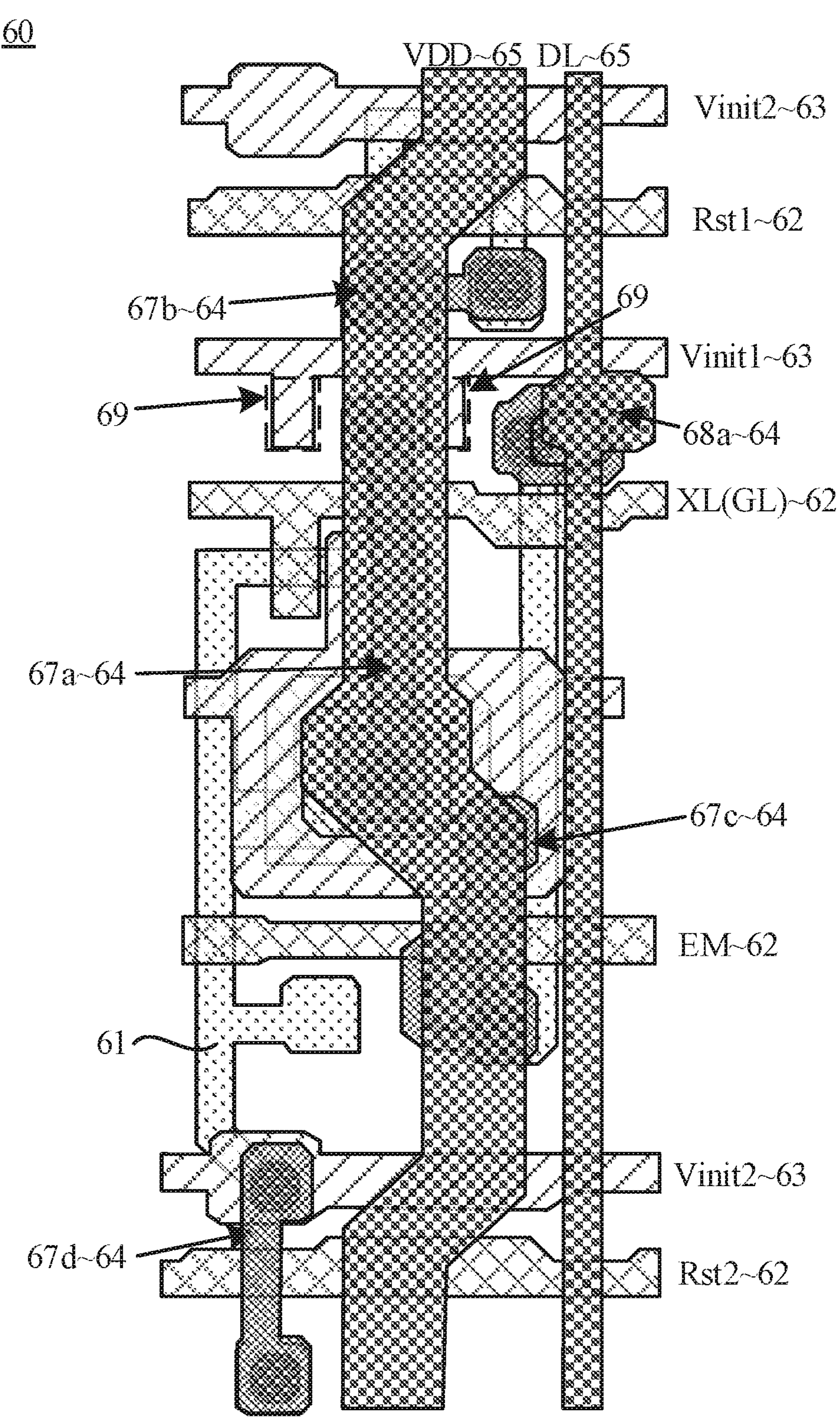
FIG. 24 is a structural diagram of a pixel driving circuit, in accordance with some embodiments.

In some embodiments, as shown in FIG. 24, the second source-drain metal layer 65 includes the power supply voltage signal lines VDD and the data lines DL. For example, a plurality of power supply voltage signal lines VDD and a plurality of data lines DL are arranged at intervals, and each pixel driving circuit 60 has a power supply voltage signal line VDD and a data line DL passed through thereon.

The data line DL is connected to the first connection end 68*a*. For example, the data line DL is electrically connected to the first connection end 68*a* through a via hole extending through the fourth insulating layer.

In some embodiments, as shown in FIGS. 22, 23 and 24, the pixel driving circuit 60 further includes a first enable transistor T5, and the active layer 61 further includes an active layer pattern of the first enable transistor T5. The connection patterns 67 further include a third connection pattern 67*c*. The third connection pattern 67*c* includes a fifth end O5, a third connection line L3 and a sixth end O6 that are connected in sequence. The fifth end O5 of the third connection pattern 67*c* is connected to the second electrode plate Cst2 through a via hole extending through the third insulating layer, and the sixth end O6 is connected to the active layer pattern of the first enable transistor T5 through a via hole extending through the first insulating layer, the second insulating layer and the third insulating layer.

For example, the fifth end O5 is connected to the second electrode plate Cst2 through the via hole extending through the third insulating layer, and the sixth end O6 is connected to a power supply voltage signal line VDD and is electrically connected to the active layer pattern of the first enable transistor T5. For example, the power supply voltage signal line VDD is connected to the sixth end O6 through a via hole extending through the fourth insulating layer, thereby realizing the connection between the active layer pattern of the first enable transistor T5 and the power supply voltage signal line VDD.

In some embodiments, as shown in FIG. 22, the pixel driving circuit 60 further includes a second enable transistor T6, and the active layer 61 further includes an active layer pattern of the second enable transistor T6. The first gate layer 62 further includes an enable signal line EM. An orthographic projection of the enable signal line EM on the substrate is overlapped with an orthographic projection of the active layer pattern of the first enable transistor T5 on the substrate and an orthographic projection of the active layer pattern of the second enable transistor T6 on the substrate.

In some examples, the enable signal line EM passes through the active layer pattern of the first enable transistor T5, and a portion of the enable signal line EM overlapped with the active layer pattern of the first enable transistor T5 is a gate pattern of the first enable transistor T5. The enable signal line EM passes through the active layer pattern of the second enable transistor T6, and a portion of the enable signal line EM overlapped with the active layer pattern of the second enable transistor T6 is a gate pattern of the second enable transistor T6.

In some embodiments, as shown in FIG. 22, the pixel driving circuit 60 further includes a second reset transistor T7, and the active layer 61 further includes an active layer pattern of the second reset transistor T7. The initialization signal lines further include second initialization signal lines Vinit2, and the second initialization signal lines Vinit2 are located in the second gate layer 63. The second initialization signal line Vinit2 is electrically connected to the active layer pattern of the second reset transistor T7.

In some examples, as shown in FIGS. 22 and 23, the connection patterns 67 further include a fourth connection pattern 67*d*, and the fourth connection pattern 67*d* includes a seventh end O7, a fourth connection line L4 and an eighth end O8 that are connected in sequence. The seventh end O7 is connected to the second initialization signal line Vinit2 through a via hole extending through the third insulating layer, and the eighth end O8 is connected to the active layer pattern of the second reset transistor T7 through a via hole extending through the first insulating layer, the second insulating layer and the third insulating layer.

In some embodiments, as shown in FIG. 22, the first gate layer 62 further includes a first reset signal line Rst1 and a second reset signal line Rst2. An orthographic projection of the first reset signal line Rst1 on the substrate overlaps with an orthographic projection of the active layer pattern of the first reset transistor T1 on the substrate. An orthographic projection of the second reset signal line Rst2 on the substrate overlaps with an orthographic projection of the active layer pattern of the second reset transistor T7 on the substrate.

In some examples, the first reset signal line Rst1 passes through the first reset transistor T1, and a portion of the first reset signal line Rst1 overlapped with the active layer pattern of the first reset transistor T1 is a gate pattern of the first reset transistor T1. The second reset signal line Rst2 passes through the second reset transistor T7, and a portion of the second reset signal line Rst2 overlapped with the active layer pattern of the second reset transistor T7 is a gate pattern of the second reset transistor T7.

It will be noted that the first reset signal line Rst1 and the second reset signal line Rst2 are relative to the layout of one pixel driving circuit 60. Specifically, in two adjacent pixel driving circuits 60 in the column direction (i.e., the second direction), a second reset signal line Rst2 of a pixel driving circuit 60 is a first reset signal line Rst1 of another adjacent pixel driving circuit 60.

In some embodiments, as shown in FIG. 22, the pixel driving circuit 60 further includes a driving transistor T3, and the active layer 61 further includes an active layer pattern of the driving transistor T3. An orthographic projection of the active layer pattern of the driving transistor T3 on the substrate is overlapped with an orthographic projection of the first electrode plate Cst1 on the substrate.

In some examples, the first electrode plate Cst1 passes through the active layer pattern of the driving transistor T3, and a portion of the first electrode plate Cst1 overlapped with the active layer pattern of the driving transistor T3 is a gate pattern of the driving transistor T3. The first electrode plate Cst1 is connected to the second end O2 of the first connection pattern 67*a*, and an orthographic projection of the second electrode plate Cst2 on the substrate overlaps with the orthographic projection of the first electrode plate Cst1 on the substrate, and thus the second electrode plate Cst2 is provided with a via hole for the second end passing through.

In another aspect, as shown in FIG. 10, some embodiments of the present disclosure provide a display panel 100, and the display panel 100 includes the array substrate 10 in any of the embodiments in the above aspect.

The array substrate 10 has functions of stabilizing the voltage of the conductive area of the compensation transistor T2 and stabilizing the voltage at the first node N1. The display panel 100 using the array substrate 10 has the same function as the above-mentioned array substrate 10. Correspondingly, the display panel 100 can significantly improve the quality of the display image.

In some embodiments, the display panel 100 further includes an anode layer 21 disposed on the array substrate 10, a light-emitting layer 22 disposed on a side of the anode layer 21 away from the substrate 40, a cathode layer 23 disposed on a side of the light-emitting layer 22 away from the substrate 40 and an encapsulation layer 30 disposed on a side of the cathode layer 23 away from the substrate 40. The anode layer 21 includes a plurality of anodes 21*a*.

In some examples, the anode layer 21 is provided on the array substrate 10. The anode layer 21 includes the plurality of anodes 21*a*, and each pixel driving circuit 60 is electrically connected to an anode 21*a*. The light-emitting layer 22 and the cathode layer 23 are provided in sequence on the side of the anode layer 21 away from the array substrate 10. The anode layer 21, the light-emitting layer 22 and the cathode layer 23 are the light-emitting device layer 20. The encapsulation layer 30 is provided on a side of the light-emitting device layer 20 away from the array substrate 10. The encapsulation layer 30 is used to protect the light-emitting device layer 20, so as to avoid moisture and oxygen corrosion of the light-emitting device layer 20 by external environment.

In yet another aspect, some embodiments of the present disclosure provide a display apparatus, and the display apparatus includes the display panel in any of the embodiments in the above another aspect.

The display apparatus in the embodiments of the present disclosure has the same beneficial effects as the display panel, which will not be repeated herein.

The display apparatus provided by the embodiments of the present disclosure may be any apparatus that displays images whether in motion (e.g., a video) or stationary (e.g., a still image) and regardless of text or image. More specifically, it is expected that the embodiments may be implemented in or associated with a variety of electronic devices. The variety of electronic devices may include (but are not limit to), for example, mobile phones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat-panel displays, computer monitors, car displays (such as odometer displays), navigators, cockpit controllers and/or displays, camera view displays (such as rear view camera displays in vehicles), electronic photos, electronic billboards or signs, projectors, architectural structures, packaging and aesthetic structures (such as displays for displaying an image of a piece of jewelry).

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. An array substrate, comprising a plurality of pixel driving circuits arranged in an array, each pixel driving circuit in the plurality of pixel driving circuits at least including a compensation transistor; the array substrate comprising:

a substrate;

an active layer disposed on the substrate, wherein the active layer includes an active layer pattern of the compensation transistor, and the active layer pattern of the compensation transistor includes two channel areas and a conductive area located between the two channel areas;

a first gate layer disposed on a side of the active layer away from the substrate, wherein the first gate layer includes a first gate signal line, and an orthographic projection of the first gate signal line on the substrate is overlapped with orthographic projections of the two channel areas on the substrate; and a second gate layer disposed on a side of the first gate layer away from the substrate, wherein the second gate layer includes a voltage stabilizing pattern, the voltage stabilizing pattern is configured to receive a power supply voltage signal, and an orthographic projection of the voltage stabilizing pattern on the substrate is overlapped with an orthographic projection of the conductive area on the substrate.

2. The array substrate according to claim 1, wherein the two channel areas include a first channel area and a second channel area;

the active layer pattern of the compensation transistor includes a first pattern and a second pattern that are connected, the first pattern extends in a first direction, the second pattern extends in a second direction, and the first direction intersects the second direction; the first channel area is located in the first pattern, the second channel area is located in the second pattern, and the conductive area is located at a connection position between the first pattern and the second pattern; and the first gate signal line includes a first gate signal main line and at least one first extension portion connected to the first gate signal main line, the first gate signal main line extends in the first direction, and the first extension portion extends in the second direction; an orthographic projection of the first gate signal main line on the substrate is overlapped with an orthographic projection of the second pattern on the substrate, and an orthographic projection of a first extension portion in the at least one first extension portion on the substrate is overlapped with an orthographic projection of the first pattern on the substrate.

3. The array substrate according to claim 1, wherein the pixel driving circuit further includes a capacitor;

the first gate layer further includes a first electrode plate of the capacitor;

the second gate layer further includes a second electrode plate of the capacitor, and an orthographic projection of the second electrode plate on the substrate is overlapped with an orthographic projection of the first electrode plate on the substrate; and the voltage stabilizing pattern is connected to the second electrode plate, and the voltage stabilizing pattern is located on a side of the second electrode plate proximate to the first gate signal line.

4. The array substrate according to claim 3, wherein the orthographic projection of the first gate signal main line on the substrate and the orthographic projection of the first extension portion in the at least one first extension portion have at least one corner, and the orthographic projection of the voltage stabilizing pattern on the substrate is located on an inner side of a corner.

5. The array substrate according to claim 1, further comprising:

a first insulating layer disposed between the active layer and the first gate layer;

a second insulating layer disposed between the first gate layer and the second gate layer;

a third insulating layer disposed on a side of the second gate layer away from the substrate; and a first source-drain metal layer disposed on a side of the third insulating layer away from the substrate, wherein the first source-drain metal layer includes a first connection end and a first connection pattern; the first connection end is connected to the active layer through a via hole extending through the first insulating layer, the second insulating layer and the third insulating layer; the first connection pattern includes a first end, a first connection line and a second end that are connected in sequence, and the first end is connected to the active layer through a via hole extending through the first insulating layer, the second insulating layer and the third insulating layer; wherein the second gate layer further includes at least one shielding pattern, an orthographic projection of a shielding pattern in the at least one shielding pattern on the substrate is located between the first connection end and the first end of the first connection pattern that are adjacent; and the at least one shielding pattern is configured to receive a constant voltage signal.

6. The array substrate according to claim 5, wherein the pixel driving circuit further includes a writing transistor, the active layer further includes an active layer pattern of the writing transistor, and the first connection end is connected to the active layer pattern of the writing transistor;

the pixel driving circuit further includes a capacitor, the first gate layer further includes a first electrode plate of the capacitor, and the second gate layer further includes a second electrode plate of the capacitor; and the first end of the first connection pattern is connected to the active layer pattern of the compensation transistor, and the second end of the first connection pattern is connected to the first electrode plate of the capacitor.

7. The array substrate according to claim 5, wherein the second gate layer further includes initialization signal lines, and the at least one shielding pattern is connected to an initialization signal line.

8. The array substrate according to claim 7, wherein the initialization signal lines include a first initialization signal line, and the first initialization signal line is connected to the at least one shielding pattern; and the pixel driving circuit further includes a first reset transistor, the active layer further includes an active layer pattern of the first reset transistor, and the first initialization signal line is electrically connected to the active layer pattern of the first reset transistor.

9. The array substrate according to claim 8, wherein the first source-drain metal layer further includes a second connection pattern; the second connection pattern includes a third end, a second connection line and a fourth end that are connected in sequence; the third end is connected to the first initialization signal line through a via hole extending through the third insulating layer, and the fourth end is connected to the active layer pattern of the first reset transistor through a via hole extending through the first insulating layer, the second insulating layer and the third insulating layer.

10. The array substrate according to claim 5, further comprising:

a fourth insulating layer disposed on a side of the first source-drain metal layer away from the substrate; and a second source-drain metal layer disposed on a side of the fourth insulating layer away from the substrate, and the second source-drain metal layer including a data line and a power supply voltage signal line; wherein the data line is connected to the first connection end through a via hole extending through the fourth insulating layer.

11. The array substrate according to claim 10, wherein the pixel driving circuit further includes a capacitor, the first gate layer further includes a first electrode plate of the capacitor, and the second gate layer further includes a second electrode plate of the capacitor:

the first source-drain metal layer further includes at least one third connection pattern;

a third connection pattern includes a fifth end, a third connection line and a sixth end that are connected in sequence; the fifth end is connected to the second electrode plate of the capacitor through a via hole extending through the third insulating layer, and the power supply voltage signal line is connected to the sixth end through a via hole extending through the fourth insulating layer; and the pixel driving circuit further includes a first enable transistor, the active layer further includes an active layer pattern of the first enable transistor, and the sixth end of the third connection pattern is connected to the active layer pattern of the first enable transistor through a via hole extending through the first insulating layer, the second insulating layer and the third insulating layer.

12. The array substrate according to claim 11, wherein the pixel driving circuit further includes a second enable transistor, and the active layer further includes an active layer pattern of the second enable transistor; and the first gate layer further includes an enable signal line, and an orthographic projection of the enable signal line on the substrate is overlapped with an orthographic projection of the active layer pattern of the first enable transistor on the substrate and an orthographic projection of the active layer pattern of the second enable transistor on the substrate.

13. The array substrate according to claim 12, wherein the pixel driving circuit further includes a second reset transistor, and the active layer further includes an active layer pattern of the second reset transistor; and the second gate layer further includes initialization signal lines, and the initialization signal lines include a second initialization signal line, and the second initialization signal line is connected to the active layer pattern of the second reset transistor.

14. The array substrate according to claim 13, wherein the first gate layer further includes a first reset signal line and a second reset signal line;

the pixel driving circuit further includes a first reset transistor, the active layer further includes an active layer pattern of the first reset transistor;

an orthographic projection of the first reset signal line on the substrate is overlapped with an orthographic projection of the active layer pattern of the first reset transistor on the substrate; and an orthographic projection of the second reset signal line on the substrate is overlapped with an orthographic projection of the active layer pattern of the second reset transistor on the substrate.

15. The array substrate according to claim 13, wherein the pixel driving circuit further includes a driving transistor, the active layer further includes an active layer pattern of the driving transistor; and an orthographic projection of the active layer pattern of the driving transistor on the substrate is overlapped with an orthographic projection of the first electrode plate on the substrate.

16. A display panel, comprising the array substrate according to claim 1.

17. The display panel according to claim 16, further comprising:

an anode layer disposed on the array substrate, the anode layer including a plurality of anodes;

a light-emitting layer disposed on a side of the anode layer away from the substrate;

a cathode layer disposed on a side of the light-emitting layer away from the substrate; and an encapsulation layer disposed on a side of the cathode layer away from the substrate.

18. A display apparatus, comprising the display panel according to claim 16.

* * * * *